US011024482B2

(12) United States Patent
Harada et al.

(10) Patent No.: US 11,024,482 B2
(45) Date of Patent: Jun. 1, 2021

(54) HOLOGRAPHY RECONSTRUCTION METHOD AND PROGRAM

(71) Applicant: RIKEN, Saitama (JP)

(72) Inventors: Ken Harada, Wako (JP); Kodai Niitsu, Wako (JP); Keiko Shimada, Wako (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 16/497,738

(22) PCT Filed: Mar. 22, 2018

(86) PCT No.: PCT/JP2018/011397
§ 371 (c)(1),
(2) Date: Sep. 25, 2019

(87) PCT Pub. No.: WO2018/198613
PCT Pub. Date: Nov. 1, 2018

(65) Prior Publication Data
US 2020/0105498 A1 Apr. 2, 2020

(30) Foreign Application Priority Data

Apr. 28, 2017 (JP) .............................. JP2017-090408

(51) Int. Cl.
*H01J 37/22* (2006.01)
*G03H 1/00* (2006.01)
(Continued)

(52) U.S. Cl.
CPC ........... *H01J 37/22* (2013.01); *G03H 1/0005* (2013.01); *G03H 1/0443* (2013.01); *G03H 1/16* (2013.01);
(Continued)

(58) Field of Classification Search
CPC .. G03H 1/0005; G03H 1/0248; G03H 1/0443; G03H 1/16; G03H 1/08;
(Continued)

(56) References Cited

U.S. PATENT DOCUMENTS 5,982,483 A * 11/1999 Lauinger .............. G01B 11/026
356/239.2
6,122,419 A * 9/2000 Kurokawa ......... G02B 6/12007
372/77
(Continued)

FOREIGN PATENT DOCUMENTS

WO 2006/115114 A1 11/2006
WO 2014/167884 A1 10/2014
(Continued)

OTHER PUBLICATIONS

Rolf Lauer, et al., "Interferometry by Electron Fourier Holography", Wissenschaftliche Verlagsgesellschaft mbH, Stuttgart, 67, No. 3 (1984) pp. 291-293.
(Continued)

*Primary Examiner* — David A Vanore
(74) *Attorney, Agent, or Firm* — Miles & Stockbridge, P.C.

(57) ABSTRACT

A lensless Fourier transform holography high accuracy reconstruction method using a charged particle beam apparatus which holds a sample on a diffraction surface of a diffraction grating provided on the downstream side of a traveling direction of the charged particle beam and which is formed of a material having permeability. The charged particle beam passed through the diffraction surface is image-formed, and the formed image is detected. An opening region of the diffraction grating is smaller than an irradiation region of the charged particle beam on the diffraction grating. Image data is obtained in a state where the irradiation region of the charged particle beam diffracted (Continued)

with the diffraction grating is within the irradiation region of the charged particle beam transmitted through the diffraction grating. Plural holograms obtained based on the image data are Fourier transformed and an intensity distribution image is displayed and stored.

15 Claims, 26 Drawing Sheets

(51) Int. Cl.
    *G03H 1/04*     (2006.01)
    *G03H 1/16*     (2006.01)
    *H01J 37/20*     (2006.01)
    *H01J 37/295*     (2006.01)

(52) U.S. Cl.
    CPC ............ *H01J 37/20* (2013.01); *H01J 37/295* (2013.01); *G03H 2001/005* (2013.01); *H01J 2237/226* (2013.01); *H01J 2237/2614* (2013.01)

(58) Field of Classification Search
CPC .. G03H 1/0808; G03H 1/0841; G03H 1/0866; G03H 1/0891; G03H 1/18; G03H 2001/0016; G03H 2001/005; G03H 2001/0452; G03H 2001/2244; G03H 2001/2292; G03H 2001/303; G03H 2222/44; G03H 2223/13; G03H 2223/23; G03H 5/00; H01J 37/22; H01J 37/20; H01J 37/295; H01J 2237/226; H01J 2237/2614
USPC ......... 250/307, 311; 385/37, 31, 129, 39, 46
See application file for complete search history.

(56) References Cited

U.S. PATENT DOCUMENTS

| | | | | |
|---|---|---|---|---|
| 6,879,441 | B1* | 4/2005 | Mossberg | G02B 5/203 359/29 |
| 7,742,674 | B2* | 6/2010 | Mossberg | G02B 5/203 385/129 |
| 2005/0093856 | A1* | 5/2005 | Borgsmuller | G03H 1/08 345/418 |
| 2005/0207313 | A1* | 9/2005 | Handschy | G03H 1/16 369/103 |
| 2009/0052619 | A1 | 2/2009 | Endoh | |
| 2012/0153144 | A1* | 6/2012 | McMorran | H01J 37/28 250/307 |
| 2013/0168577 | A1 | 7/2013 | Grillo et al. | |
| 2017/0194065 | A1 | 7/2017 | Harada et al. | |
| 2019/0196070 | A1* | 6/2019 | Harada | H01J 37/295 |
| 2020/0105498 | A1* | 4/2020 | Harada | G03H 5/00 |
| 2020/0272100 | A1* | 8/2020 | Yu | G03H 1/0443 |

FOREIGN PATENT DOCUMENTS

| | | |
|---|---|---|
| WO | 2015/118624 A1 | 8/2015 |
| WO | 2017/183472 A1 | 10/2017 |

OTHER PUBLICATIONS

Benjamin J. McMorran, et al., "Electron Vortex Beams With High Quanta of Orbital Angular Momentum", Science, Jan. 14, 2011, vol. 331, pp. 192-195.
G. W. Stroke, et al., "Three-Dimensional Holography With "Lensless" Fourier-Transform Holograms and Coarse P/N Polaroid Film", J. Opt. Soc. Am. 55 (1965) 1327.
International Search Report of PCT/JP218/011397.
J. Verbeeck et al., "Production and Application of Electron Vortex Beams", Nature, Sep. 16, 2010, vol. 467, pp. 301-304.

* cited by examiner

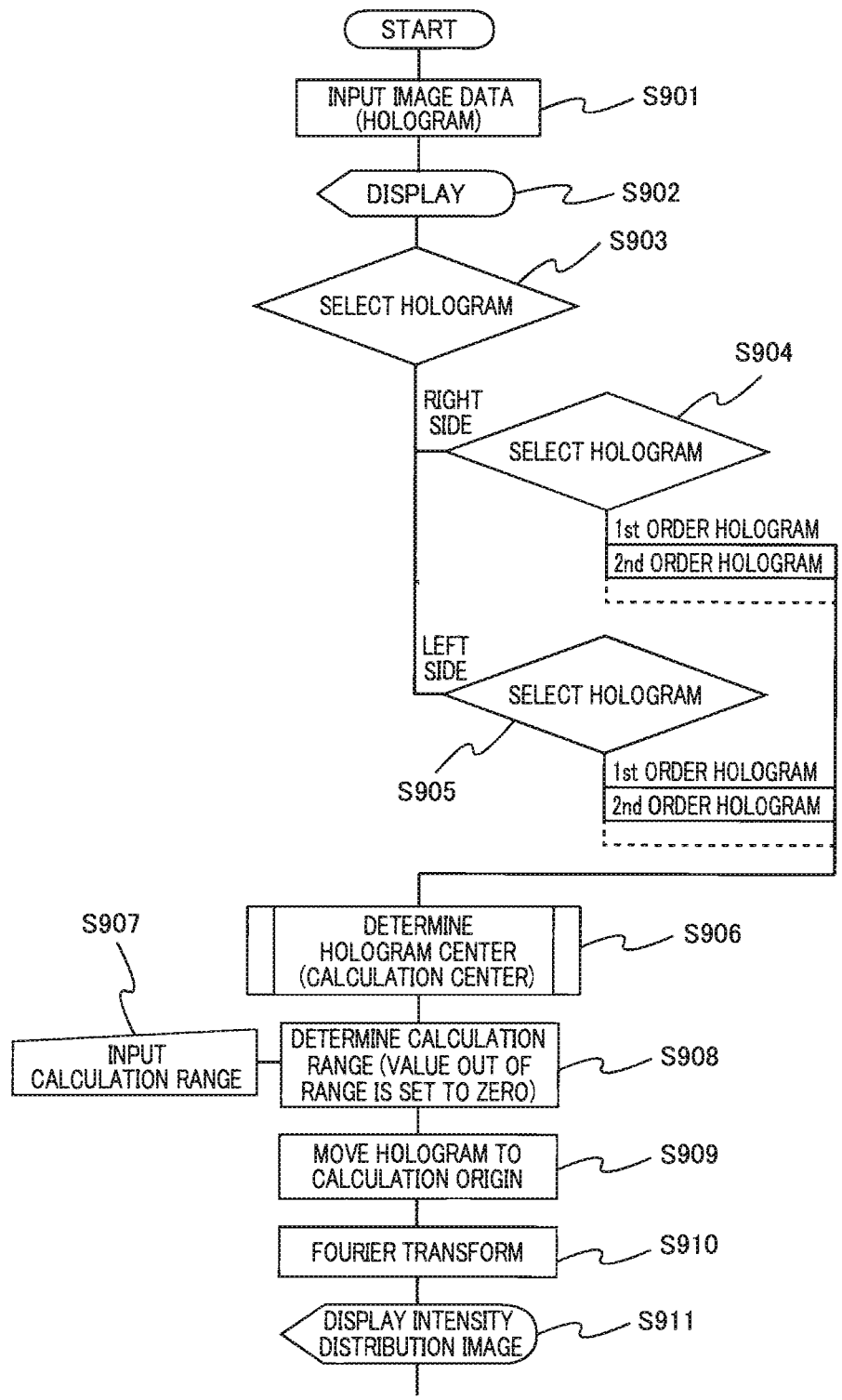

(a)

(b)

(c)

(d)

HOLOGRAPHY RECONSTRUCTION METHOD AND PROGRAM

TECHNICAL FIELD

The present invention relates to a particle beam apparatus utilizing a diffraction effect, and more particularly, to a reconstruction technique advantageous to holography using a diffraction grating.

BACKGROUND ART

Regarding a charged particle beam such as an electron beam or an ion beam, since it is propagated in vacuum, its wavelength is short, e.g., several pm, its deflection angle is small, and there is no effective beam splitter such as a half mirror in optics, it is difficult to form plural optical paths to independently form optical systems as in the case of a Mach-Zehnder interferometer in an optical bench. Further, regarding a short-wavelength electromagnetic wave such as an ultraviolet ray or an X-ray, it is difficult to form an effective optical device due to its good permeability. Further, there is no optical device for a particle beam such as a neutron beam, a molecular beam, or a heavy particle beam. Accordingly, a sample is provided between a light source and a detector, and merely observation of a scattered/absorption image in the sample by path propagation, or observation of a diffraction pattern based on interference/diffraction effect is performed. That is, in any of the above-described electromagnetic wave apparatus and particle beam apparatus, a single-path optical system is used. It is necessary to use the same lens, the same deflector and the like for a transmitted beam transmitted through a sample and a scattered/diffracted beam. A measurement method using the same optical conditions is used.

Among the above-described apparatuses, development of an electron microscope using an electron beam is most advanced. Various optical devices such as an electronic lens, a deflector, an electron beam biprism are realized. However, in principle, it is necessary to propagate the electron beam in vacuum, and the microscope is merely configured with a single-path optical system in an evacuated lens barrel. Even when the electron beam biprism which is the only effective beam splitter in electron beam interference is used, its deflection angle is small, i.e., $10^{-3}$ rad at maximum. Still the same limitation that the same lens and deflector must be used for two paths is posed as in the other particle beam apparatuses. Accordingly, it is difficult to produce coarseness and fineness of electron beam irradiation within the same field of view. It has been difficult to simultaneously observe a sample charging effect and a degree of sample damage due to electron beam irradiation while comparing and referring to two irradiation conditions, further, it has been especially difficult to observe progress of change of the charging effect and the degree of sample damage.

Although it is not a countermeasure against these problems, as Fourier transform holography using an electron beam and a lens, Non-Patent Literature 1 disclosing a technique of producing two irradiation conditions within a single lens barrel and Patent Literature 1 disclosing a possibility of producing two irradiation conditions with an X-ray are known. Non-Patent Literature 1 discloses a technique utilizing a back focal plane of an objective lens for an electron beam transmitted through a scatter plate formed of an amorphous film as a sample surface. The technique utilizes a phenomenon that an electron beam, which has not been scattered with the scatter plate and been transmitted, is formed in a spot on an optical axis, while an electron beam, which has been scattered at random with the amorphous film, spreads flat on the back focal plane. Interference between the spot on the optical axis and the electron beam in the flat portion is utilized.

Patent Literature 1 discloses use of a zone plate having a hole in place of the scatter plate in Non-Patent Literature 1. The focus by lens effect of the zone plate becomes a spot. The X-ray passed through the hole becomes a plane wave. These examples are not practical as holography, and not popular. Further, it is impossible to realize these configurations in a particle beam apparatus without a lens.

CITATION LIST

Patent Literature

PTL 1: PCT International Publication No. WO2006/115114

Non-Patent Literature

Non-Patent Literature 1: R. Lauer; Optik, 67 (1984) 291.
Non-Patent Literature 2: B. J. McMorran et al., Science 331 (2011) 192.
Non-Patent Literature 3: G. W. Stroke et al., J. Opt. Soc. Am. 55 (1965) 1327.

SUMMARY OF INVENTION

Technical Problem

As described above, in the short-wavelength electromagnetic wave apparatuses using an ultraviolet ray, an X-ray and the like and particle beam apparatuses, it is necessary to use only a single-path optical system, i.e., the measurement method of applying the same optical conditions such as the same lens and the same deflector to a transmitted beam transmitted through a sample and a scattered/diffracted beam. Accordingly, it has been difficult to produce coarseness and fineness of electron beam irradiation with two optical states within the same field of view. It has been difficult to locally increase the irradiation amount to attain high brightness while irradiating a wide range and realizing high magnification observation, or to refer to a peripheral region to observe the change of irradiation amount dependence in the local sample state, or upon processing or the like, to perform pinpoint local high-density irradiation while entirely performing constant low-dose irradiation, to perform processing/adjustment.

The present inventors have proposed a particle beam apparatus, an observation method, and a diffraction grating capable of solving the above-described problems and creating coarseness and fineness of particle beam irradiation with two optical states within the same field of view (PCT/JP2017/014393). That is, a particle beam apparatus, an observation method, and a diffraction grating, and the particle beam apparatus including: a particle beam source to generate a particle beam; an irradiation unit to irradiate the sample with the particle beam; a sample holding unit to hold the sample; a detection unit to obtain the particle beam transmitted through the sample; a diffraction grating, provided on the upstream side of the sample in a traveling direction of the particle beam, on the downstream side of the traveling direction of the particle beam in the irradiation unit, and formed of a material having permeability with respect to the particle beam; and a holding device to realize mounting/dismounting and movement of the diffraction grating on/out of an optical axis of the particle beam apparatus, and in which an opening region of the diffraction grating is smaller than an irradiation region of the particle beam to the diffraction grating has been invented. Further, as an embodiment, a Fourier transform holography with an electron microscope to obtain plural holograms by holding coherence between a transmitted wave and a diffracted wave from the diffraction grating, have been realized and disclosed.

In the above configuration, by using the diffraction grating in an irradiation optical system to the sample, an incident electron beam is subjected to Bragg diffraction and separated to plural beams. The respective diffracted waves, having phase distributions inverted with an optical axis in-between but having utterly the same other conditions, pass through the electron optical system. Accordingly, the states of aberration, noise and the like caused with the optical system are the same. These same conditionalities and time simultaneity are completely ensured. By irradiation/passing and recording the plural electron beams to respective parts of the sample or a part without sample, a single-mirror multi-beam optical system is realized. By comparing and referring to the plural images obtained in this manner, it is possible to obtain extremely high measurement accuracy.

The object of the present invention is to provide a holography reconstruction method and a program, which take advantage of the feature of simultaneous recording of plural holograms using plural charged particle beams based on diffraction using this charged particle beam apparatus.

Solution to Problem

To attain the above object, the present invention provides a holography reconstruction method with a charged particle beam apparatus, wherein the charged particle beam apparatus include: an irradiation optical system that irradiates a charged particle beam; a diffraction grating, provided on the downstream side of a traveling direction of the irradiated charged particle beam, that is formed of a material having permeability with respect to the charged particle beam; a sample holder that is capable of holding a sample on a diffraction surface of the diffraction grating; an image formation optical system that image-forms the charged particle beam passed through the diffraction surface; an image detector that detects image formation with the image formation optical system; and a controller that processes image data detected with the image detector, wherein the controller performs control to: make an opening region of the diffraction grating smaller than an irradiation region of the charged particle beam to the diffraction grating, with the irradiation region of the charged particle beam diffracted with the diffraction grating being within the irradiation region of the charged particle beam transmitted through the diffraction grating; and select at least one of plural holograms obtained based on the image data, and perform Fourier transform on the selected hologram.

Further, to attain the above object, the present invention provides a holography reconstruction program, executed with a controller to process image data, obtained from an irradiation optical system that irradiates a charged particle beam; a diffraction grating, provided on the downstream side of a traveling direction of the irradiated charged particle beam, that is made of a material having permeability with respect to the charged particle beam; a sample holder that is capable of holding a sample on a diffraction surface of the diffraction grating; an image formation optical system that image-forms the charged particle beam passed through the diffraction surface; and an image detector that detects image formation with the image formation optical system, wherein the controller is controlled to: make an opening region of the diffraction grating smaller than an irradiation region of the charged particle beam to the diffraction grating, with the irradiation region of the charged particle beam diffracted with the diffraction grating being within the irradiation region of the charged particle beam transmitted through the diffraction grating; and select at least one of plural holograms obtained based on the image data, and perform Fourier transform on the selected hologram.

Advantageous Effects of Invention

According to the present invention, it is possible to provide a reconstruction method capable of improving accuracy of a reconstructed image by comparing and referring to reconstructed images from plural holograms using plural charged particle beams based on diffraction.

BRIEF DESCRIPTION OF DRAWINGS

FIG. 9A is a diagram showing a processing flow of the Fourier transform holography reconstruction method according to Example 2.

DESCRIPTION OF EMBODIMENTS

Hereinbelow, prior to explanation of various examples of the present invention, to facilitate understanding of the present invention, the principle of the lensless Fourier transform holography and its reconstruction method in an electron microscope disclosed by the present inventors will be described in the specification of the above-described International Patent Application. Note that in the following description, an example of hologram reconstruction with a transmission electron microscope using an electron beam will be described; however, the present invention is applicable to a charged particle beam apparatus such as an He ion microscope.

Figure 1:
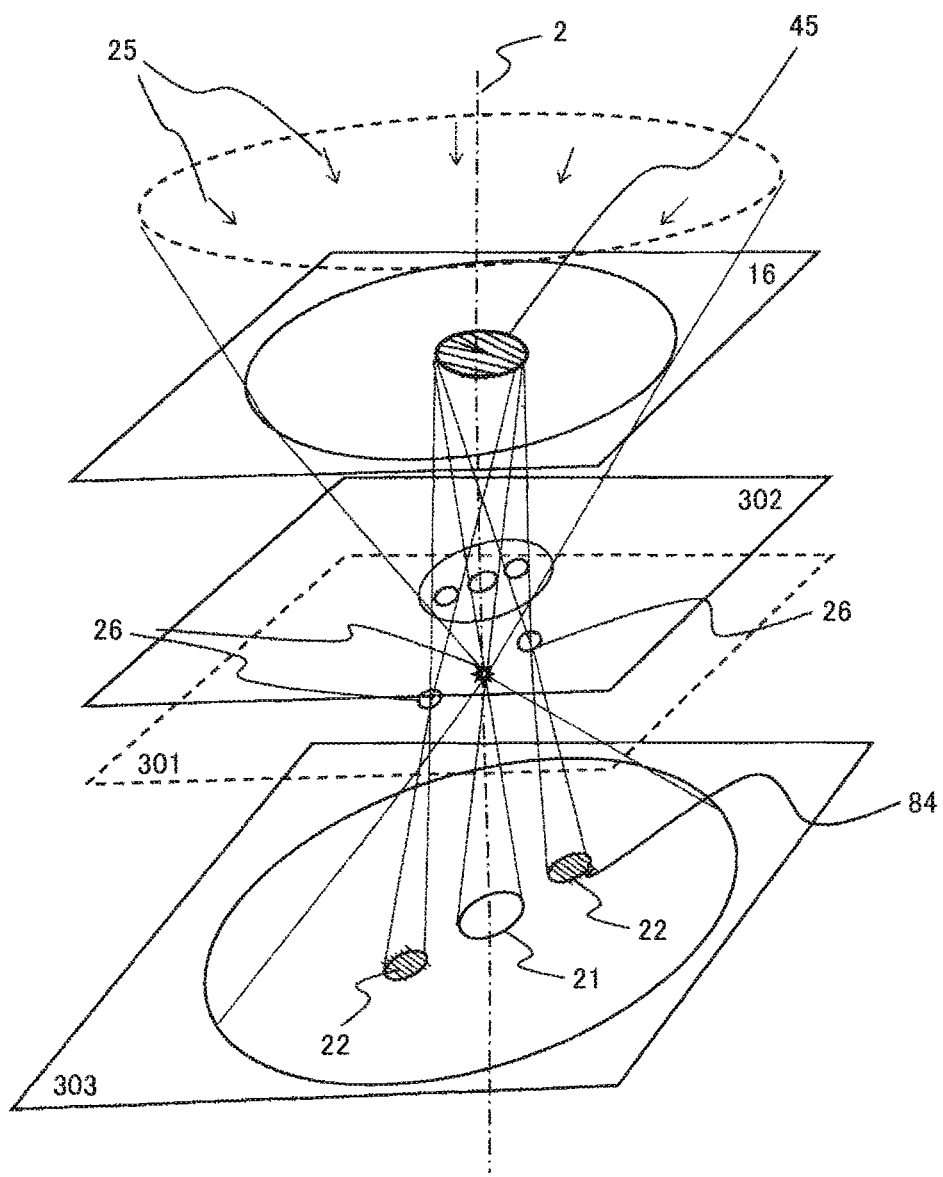
FIG. 1 is a diagram for explaining the principle of lensless Fourier transform holography with an electron microscope.

FIG. 1 is a diagram for explaining an electron microscope and an observation method using it when coherence is held between a transmitted wave and a diffracted wave from a diffraction grating 16. In this case, it is possible to realize holography with one of the transmitted wave and the diffracted wave as an object wave, while the other one, as a reference wave. That is, when the present configuration using the diffraction grating is adopted in the electron microscope, it is possible to realize electron holography even without electron beam biprism or the like.

In the figure, the state of interference between a transmitted wave 21 and a diffracted wave 22 is shown. To provide the diffracted wave 22 with spatial spread and to facilitate illustration of interference fringes 84 with respect to the transmitted wave 21, a diffraction grating 16 to be inserted will be described as an edge dislocation grating 45 for spiral wave generation, and as the diffracted wave 22, a ring-shaped diffraction spot 26 will be described. However, there is no limitation to the used of spiral wave.

Note that the spiral wave is a general term of a wave having a spiral-shaped wave surface (equiphase surface). When considered in a particle orbit, it is a beam where a charged particle beam such as an electron beam which propagates in space propagates in a whirl. It is considered that an orbital angle momentum is held in the core of the spiral wave surface or at the center of the vortex beam.

In the observation of the spiral wave, the idea of particle picture is leading. An observation method utilizing a phenomenon that the beam shape is a ring shape in reciprocal space is the main stream. On the other hand, as a technique of measuring interaction with respect to the sample, reports on the change of beam intensity distribution as well as the shift of energy distribution after transmission through the sample, or the change of sample shape due to irradiation, or the like, are known. However, they are not general yet mainly because the interaction between the spiral wave and the sample is small, and the effect of the irradiation is not sufficiently detected.

Since the spiral wave has a characteristic feature in its wave surface shape, the characteristic feature of measurement object is expected to be reflected in the wave surface. Accordingly, it is necessary to measure the phase of the spiral wave. However, up to the present date, there has been no report on the phase measurement of the spiral wave in a practical sense (see Non-Patent Literature 2). The holography is the most effective technique of detecting the phase distribution of a wave. Accordingly, in reciprocal space as practical space to use the spiral wave, as a method for obtaining a reference wave necessary for phase measurement, a method by defocus to be explained by the present inventors, i.e., lensless Fourier transform holography, is realized.

In FIG. 1, a wave, transmitted through a part of the edge dislocation grating 45 in which a grating is formed and its outside, and a wave diffracted with the edge dislocation grating 45, form a crossover 26 in the same position (height) on an optical axis 2. The surface of the crossover 26 is an image surface of a light source. The surface corresponds to a diffraction surface 301 as reciprocal space for the diffraction grating 16. Accordingly, when the diffraction grating 16 is the edge dislocation grating 45 for spiral wave generation, in addition to a spot 26 of the transmitted wave, a ring-shaped diffraction spot 26 is generated. Note that an underfocus surface 302 and an overfocus surface 303 are provided above and below the diffraction surface 301.

An incident wave 25 irradiated in a range wider than the edge dislocation grating 45 has a large convergence angle. When the incident wave propagates along the optical axis 2, it transmits through the edge dislocation grating 45, then is rapidly reduced, and forms a spot on the diffraction surface 301. Thereafter, the incident wave is rapidly enlarged. As in the case of the transmitted wave 21, the diffracted wave 22 is reduced by propagation, then the diffraction spot 26 is formed in a minimum size on the diffraction surface 301, and is enlarged. However, the degree of change in the size of the diffracted wave 22 is much smaller than that of the transmitted wave 21. Accordingly, when the distance from the diffraction surface 301 is appropriately selected to create a defocus surface, it is possible to observe the space where the transmitted wave 21 and the diffracted wave 22 overlap with each other. When the transmitted wave 21 and the diffracted wave 22 are spatially within a range of coherence distance, interference of these two waves is observed. That is, it is possible to realize lensless Fourier transform holography by utilizing defocus from the reciprocal space (diffraction space).

The characteristic feature of this optical system resides in that a light source of a reference wave (in principle, point light source) is provided in the same position as that of an object, but within a plane vertical to an optical axis of the object, and in a position away from the optical axis, and a hologram formed by superimposing an object wave propagated from the object and the reference wave propagated from the point light source is recorded. The object wave, subjected to scattering in various positions of the object, is considered as an assembly of point light sources from the respective positions as emission points, having various initial phases. The present optical system is an optical system to superimpose a wave from a single point light source as a reference wave on the assembly of waves i.e. the object wave. The respective waves have been submitted to the Fourier transform based on the propagation, and accordingly, the object wave and the reference wave are superimposed in the reciprocal space (diffraction space or diffraction surface, i.e., Fourier transform surface) even without lens. Since an interference image (hologram) equivalent to the Fourier transform holography is recorded, the method is named "lensless Fourier transform holography". Non-Patent Literature 3 discloses the lensless Fourier transform holography in the case of laser light.

The characteristic feature of the lensless Fourier transform holography reconstruction method including the Fourier transform holography resides in that a reconstructed image is obtained by one-time Fourier transform, and that a direct image and a conjugate image are reconstructed oppositely in opposite positions with an optical axis in-between. Non-Patent Literature 1 discloses electron beam Fourier transform holography using an electron beam and using a lens.

Hereinbelow, the outline of the Fourier transform reconstruction method as a mainstream of electron holography reconstruction method will be described. The conventional electron holography using a lens is classified to an image holography, and the characteristic feature resides in that an interference microscopic image where interference fringes are superimposed on a microscopic image is obtained. The hologram is the interference microscopic image without any change, and is recorded as the shift of interference fringe where the phase modulation of the electronic wave is superimposed. The image holography reconstruction method is visualization of the distribution of the shift amount of the interference fringe. Since the hologram is an image, the hologram itself lacks image formation capability. In the case of optical reconstruction using laser light, an image formation optical system using a lens is required.

The conventional Fourier transform reconstruction method is a technique of transferring the reconstruction method with the laser optical system directly onto a computer. It has been used since the most initial stage of calculation processing reconstruction method in the electron holography, and still is a mainstream reconstruction method.

Figure 2:
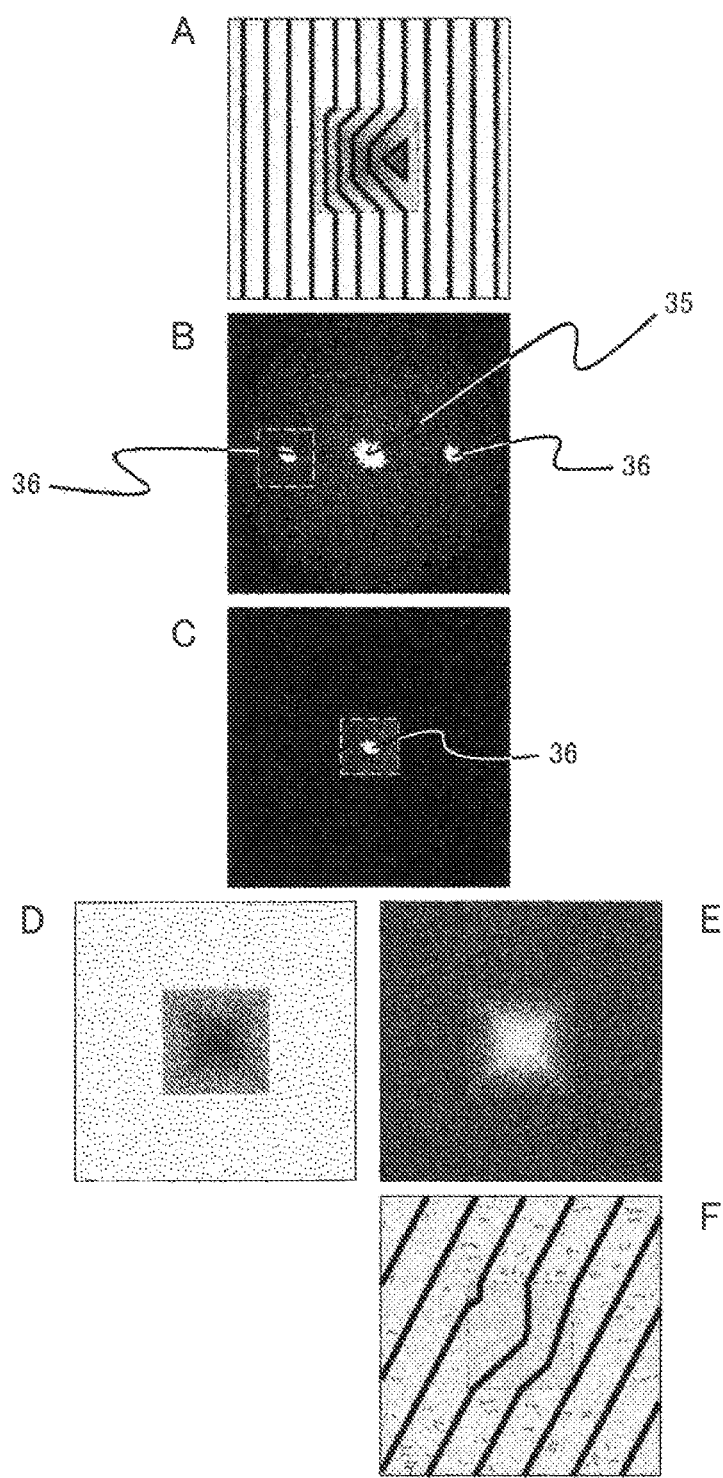
FIG. 2 is a diagram for explaining a Fourier transform reconstruction method in a conventional electron holography.
Figure 3A:
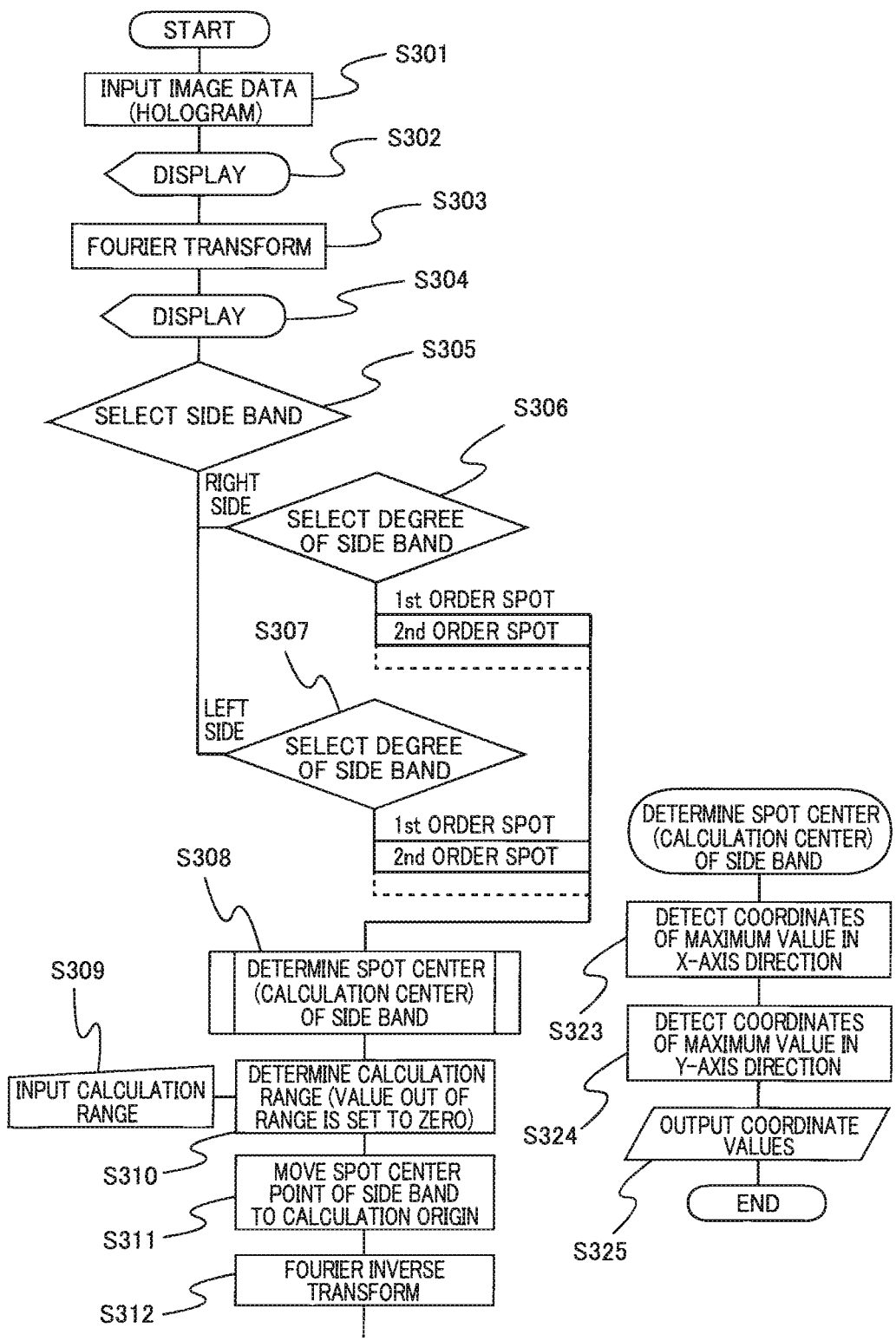
FIG. 3A is a flowchart showing reconstruction calculation processing by the Fourier transform reconstruction method.
Figure 3B:
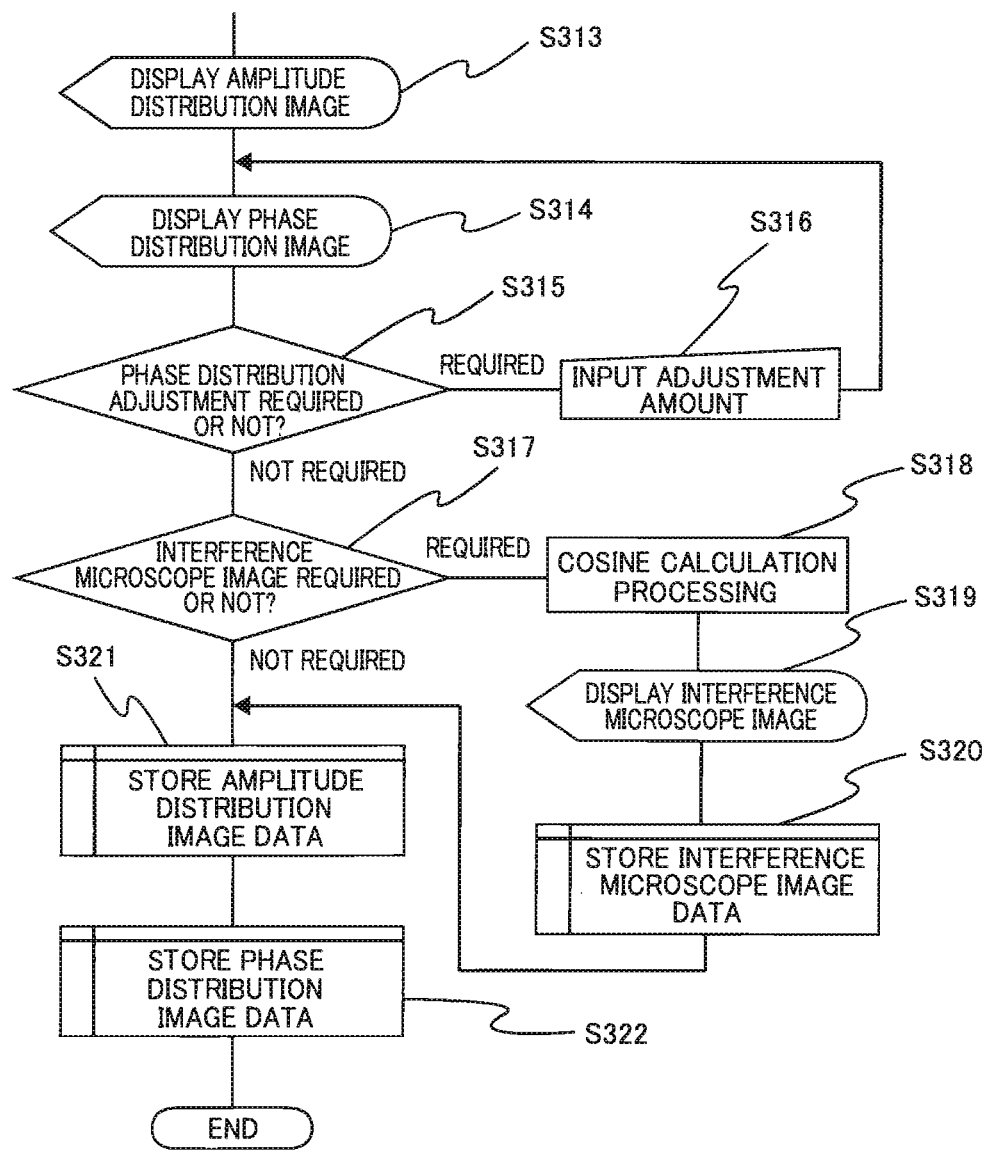
FIG. 3B is a diagram showing a flowchart (continued) showing the reconstruction calculation processing by the Fourier transform reconstruction method.

FIG. 2 shows a schematic diagram of a reconstruction procedure of the Fourier transform reconstruction method. FIG. 3A and FIG. 3B show a reconstruction flowchart of the Fourier transform reconstruction method having steps S301 to S325. In FIG. 2, A is an interference microscopic image as an inputted/displayed hologram (S301 and S302). In FIG. 2, B is a Fourier transformed image of the transformed/displayed hologram A (S303 and S304). A white distribution 35 at the center of the image is a power spectrum of a sample image. Two side bands 36 in a direction orthogonal to fringes, i.e., on the right and left sides of the Fourier transformed image B, include phase information of an object wave as a reconstruction wave (1st order diffracted wave) including phase information and its conjugate wave (−1st order diffracted wave).

An image obtained by selecting one of the two side bands 36 (S305 to S307), and moving the side band to the center of the image is C in the figure (S308 to S311). The movement to the image center corresponds to movement of origin of calculation processing. The determination of spot center (calculation center) of the side band (S308) is performed by detection of coordinates of a maximum value in an X-axis direction (S323), detection of coordinates of a maximum value in a Y-axis direction (S324), and output of coordinate values (S325).

Next, C in the figure is subjected to Fourier inverse transform (S312). It is possible to obtain and display an amplitude distribution image D and a phase distribution image E from a real part and an imaginary part of a result of calculation (S313 and S314). When the phase distribution image E is specified as an interference microscopic image, a reference wave is given again as an interference image. For example, as in the case of F in the figure, it is possible to display a phase distribution with equiphase lines in different directions. In any way, in the Fourier transform reconstruction method, it is necessary to separate the power spectrum and the side band of the sample image in the Fourier transformed image B. The interval of the interference fringes determines the spatial resolution of the reconstructed image (also of the amplitude distribution and the phase distribution).

Note that the phase distribution is merely relative, and to accurately indicate the physical quantity indicated with the phase distribution detected by the holography, e.g., a potential distribution or a magnetic field distribution, it is necessary to appropriately adjust the entire image of the phase distribution image including the background. For this purpose, it is necessary to repeat fine adjustment with respect to the phase distribution while checking the phase distribution image (S315 and S316). Generally, implementation of this method is considered in the reconstruction method by calculation processing.

Further, in the Fourier transform reconstruction method, it is possible to correct the spherical aberration and the astigmatism of the lens used upon recording of the hologram, and the defocus of the sample image. This is a technique of obtaining both of the amplitude distribution image D and the phase distribution image E as reconstructed images without the above-described aberration and defocus by, when the theoretical formula (aberration function) of the image formation is known, performing deconvolution on the image C in the figure to offset the aberration function, thereafter performing the Fourier inverse transform. This technique is utilized as a general aberration correction method in electron holography.

Further, when it is determined at step S317 that an interference microscopic image is required, cosine calculation processing is performed (S318), and an interference microscopic image is displayed (S319). Amplitude distribution image data, phase distribution image data, and interference microscopic image data, obtained in accordance with necessity, are respectively stored (S320, S321, and S322).

Next, the reconstruction technique of the lensless Fourier transform holography will be described. The reconstruction method in the Fourier transform holography and the lensless Fourier transform holography is only Fourier transform at once. The procedure will be described using holograms of an electronic spiral wave in FIG. 4 and a reconstruction processing flowchart at steps S501 to S525 in FIG. 5A and FIG.

Figure 5A:
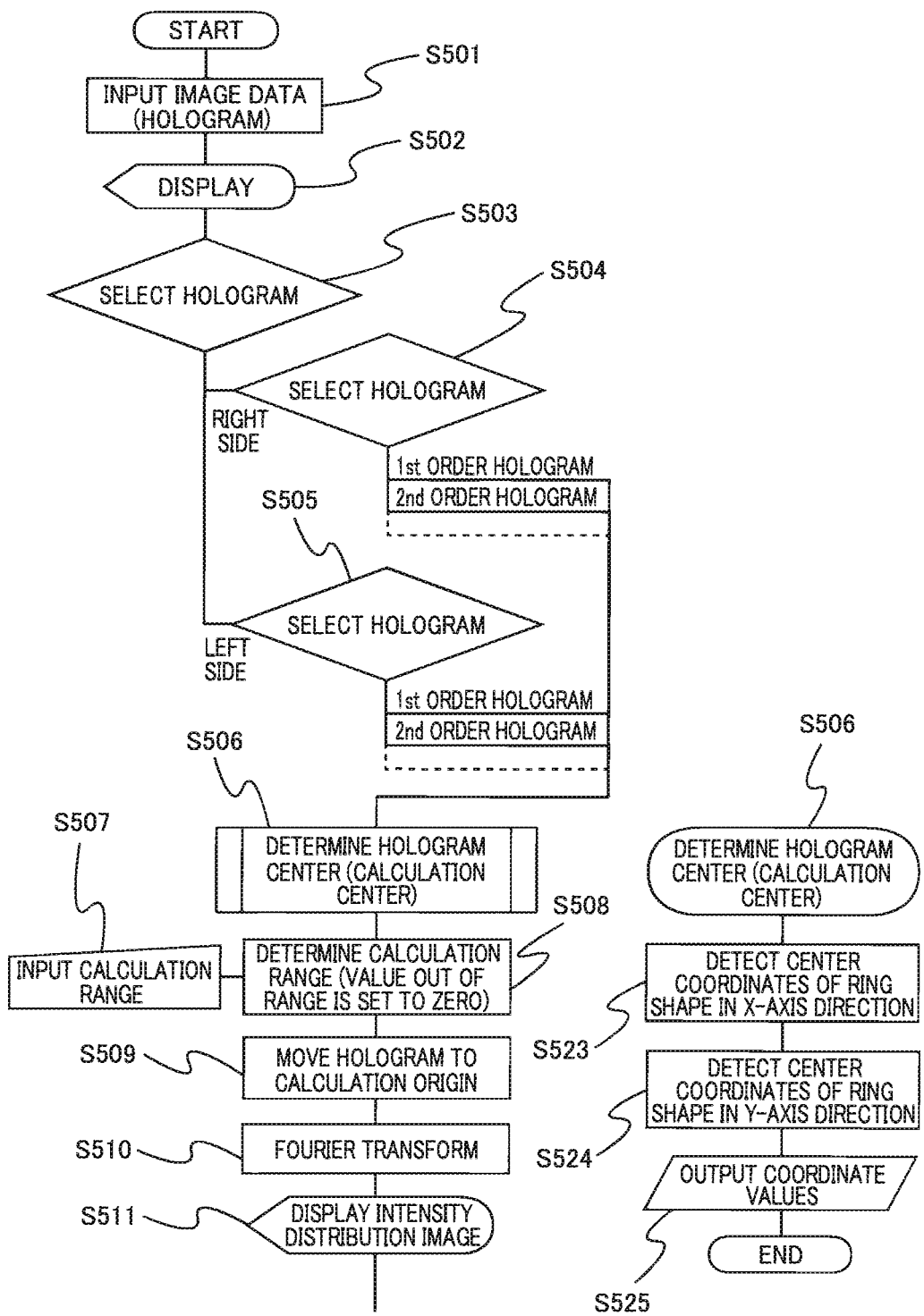
FIG. 5A is a diagram showing a flowchart showing lensless Fourier transform holography reconstruction processing.
Figure 5B:
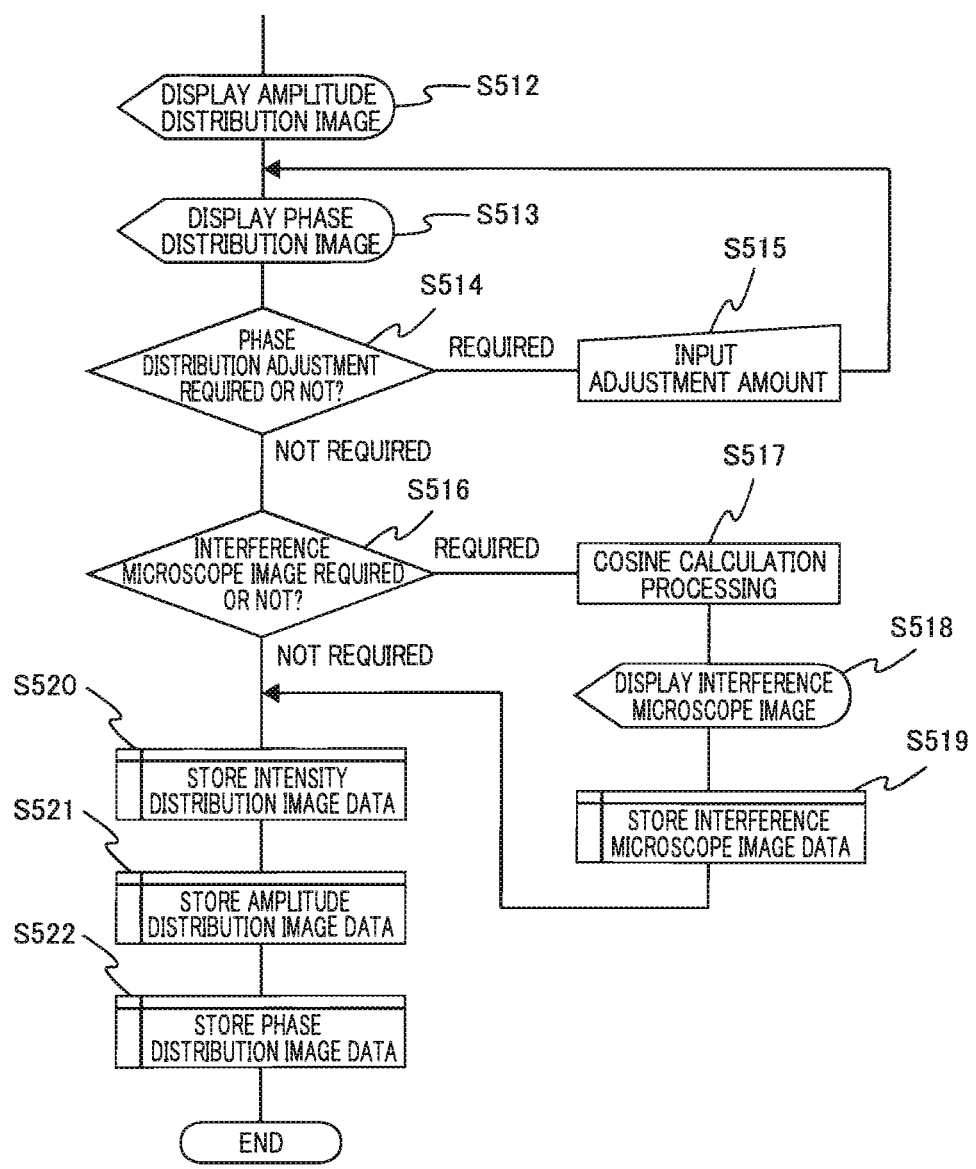
FIG. 5B is a diagram showing a flowchart (continued) showing the lensless Fourier transform holography reconstruction processing.

5B. Note that steps S512 to S522 in FIG. 5B overlap steps S313 to S322 in FIG. 3B except storage of intensity distribution image data (S520), and accordingly, explanations of these steps will be omitted.

Figure 4:
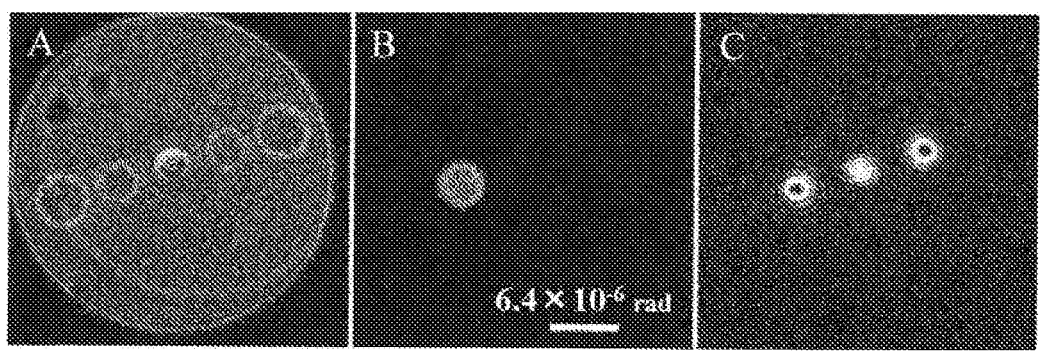
FIG. 4 is a diagram showing an example of a hologram recorded with an electronic spiral wave.

A of FIG. 4 is a hologram of an electronic spiral wave obtained by defocusing the diffraction image of the edge dislocation grating 45 in FIG. 1 and by interference with the transmitted wave up to the ±2nd order diffracted wave. As a diffraction grating, a 5th order edge dislocation grating 45 is used. The image data of the hologram is inputted, and displayed (S501 to S502). Then, a hologram is selected. For example, a left side hologram is selected (S503 to S505). B of FIG. 4 is a hologram (before centering) extracted by mask processing on only the hologram of the left side −1st order diffraction spot. C in the figure is a Fourier transform image of B (S506 to S511). It is understood that left and right ring-shaped diffraction spots of the spiral wave are symmetrically reconstructed. In the case in C of FIG. 4, the left side corresponds to a direct image, and the right side corresponds to a conjugate image. Note that C in the figure is not a reconstructed image of A. One of the ring-shaped spiral wave diffraction spots (a ring-shaped spot on the left side of C and its conjugate image (corresponding to the right side)) on the diffraction surface is reconstructed. This is apparent because a double ring (Bessel ring) is also observed outside the ring of C. That is, the reconstruction of the electronic wave is completed by only the Fourier transform at once.

Example 1

Various examples of a lensless Fourier transform holography reconstruction method and its program will be described sequentially, based on the principle of the lensless Fourier transform holography using the diffraction grating previously invented by the present inventors as schematically described above. First, as a particle beam apparatus system used in common in the reconstruction method according to the respective examples, a configuration example using a transmission electron microscope will be described by using FIG. 19.

Figure 19:
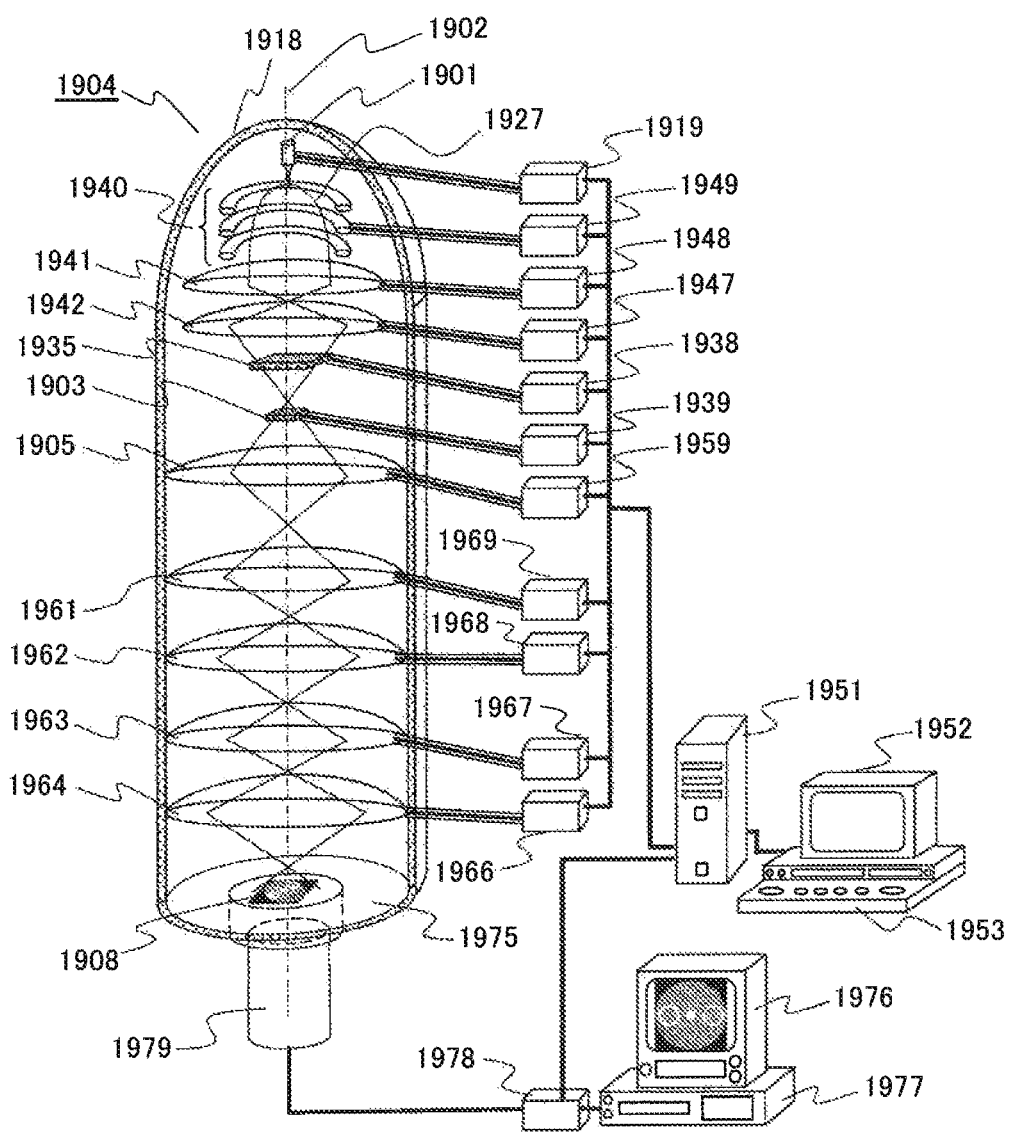
FIG. 19 is a diagram showing a configuration example of a particle beam apparatus system utilized in the respective examples in common.

As a charged particle beam apparatus 1904 in FIG. 19, it is assumed that a general-purpose electron microscope having an accelerating voltage of about 100 kV to 300 kV is used. Accordingly, an irradiation optical system is provided on the upper side of a sample, i.e., on the upstream side of a direction in which a particle beam flows, and an image formation optical system is provided on the lower side of the sample, i.e., on the downstream side of the direction in which the particle beam flows.

The configuration of an interference type electron microscope is taken up in the present example as the particle beam apparatus system because among the particle beam apparatus systems, not only development of the interference type electron microscope is advanced as the most complicated system but also the system has a versatility in use of the apparatus. For example, in the system of the charged particle beam apparatus 1904 in FIG. 19, when all the lenses of the irradiation optical system are turned off, the system has a form to directly irradiate the sample with an electron beam from a particle source. When the image formation optical system is also turned off, the system becomes the simplest electron diffraction apparatus. That is, the system can be configured as a form simulating a neutron beam apparatus, a heavy particle beam, and an X-ray apparatus. Note that the application object in the respective examples is not limited to the interference type electron microscope having the configuration in FIG. 19.

In FIG. 19, an electron gun 1901 as a particle source is positioned in the most upstream portion of a direction in which an electron beam flows. Under the control of a control unit 1919 for the particle beam and a control unit 1949 for an acceleration tube 1940, the emitted electron beam is accelerated to a predetermined speed with the acceleration tube 1940, then through condenser lenses 1941 and 1942 of the irradiation optical system controlled with control units 1947 and 1948, adjusted to have predetermined intensity and irradiation region, and is irradiated to a diffraction grating 1935 above the sample. The diffraction grating 1935 corresponds to the diffraction grating 16 shown in FIG. 1. The transmitted wave transmitted through the diffraction grating 1935 and the diffracted wave are irradiated to the sample 1903. The electron beam transmitted through the sample 1903 is image-formed with an objective lens 1905 controlled with a control unit 1959. Imaging lens systems 1961, 1962, 1963 and 1964, controlled with control units 1969, 1968, 1967, and 1966, at the subsequent stage of the objective lens 1905, succeed to the image forming action. Finally, a final image 1908 is image-formed on an observation recording surface 1975 of the electron beam apparatus. The image is observed on a screen of e.g. an image data monitor 1976 through an image detector 1979 such as a CCD camera and an image data controller 1978, or stored as image data in an image data recorder 1977.

The transmitted wave transmitted through the diffraction grating 1935 and the diffracted wave are irradiated to the sample 1903 without any optical system. The position of crossover as a position of the image of the light source can be arbitrarily selected with the irradiation optical system. FIG. 19 illustrates the crossover when positioned between the diffraction grating and the sample. With this configuration, the image of the sample 1903 is enlarged with the imaging lens systems 1961, 1962, 1963, and 1964 at the subsequent stage of the objective lens, and image-formed on the observation recording surface 1975.

These devices are systemized as a whole. An operator checks control states of the devices on a screen of a monitor 1952, and various programs are executed via an interface 1953. It is possible to control an electron gun 191, the acceleration tube 1940, the respective lenses, the sample 1903, the diffraction grating 1935, the image detector 1979, and the like, by controlling the control unit 1938 for the diffraction grating 1935, the control unit 1939 for the sample 1903, the control unit 1947 for the second irradiation lens 1942, the control unit 1948 for the first irradiation lens 1941, the control unit 1949 for the acceleration tube 1940, the control unit 1959 for the objective lens 1905, the control unit 1966 for the fourth imaging lens 1964, the control unit 1967 for the third imaging lens 1963, the control unit 1968 for the second imaging lens 1962, the control unit 1969 for the first imaging lens 1961, and the control unit 1978 for the image detector 1979, by using a system control computer 1951. Further, the system control computer 1951 can also function as an image processing computer to perform various processing on previously stored image data. In the present specification, the system control computer 1951, the respective control units 1938 to 1978 controlled with the computer, further, the monitor 1952, and the interface 1953 may be generically named controller. In the various types of the lensless Fourier transform holography reconstruction method to be described in detail, to realize a processing flowchart corresponding to the respective examples, the system control computer 1951 of the controller appropriately controls the respective control units 1938 to 1978 of the controller by performing various programs, and further, performs image data processing.

Note that as a particle beam apparatus system, the description has been made based on the transmission electron microscope; however, the system may be used in a charged particle beam apparatus such as an ion microscope, a molecular beam apparatus, a heavy particle beam apparatus, a neutron bean apparatus, and widely, in an electromagnetic wave apparatus such as an X-ray. It goes without saying that, at that time, the configuration of the optical system is changed based on characteristic of each apparatus. Note that many of the assumed particle beam apparatuses are provided with a vacuum exhaust system to evacuate the apparatus since the propagation of the particle beam is limited to a vacuum; however, since this system does not directly relate to the present invention, illustration and a description of the system have been omitted.

Next, using the above-described transmission electron microscope system, an example of the lensless Fourier transform holography reconstruction method effective to an electronic spiral wave will be described as Example 1. That is, it is an example of the lensless Fourier transform holography reconstruction method with a charged particle beam apparatus, wherein the charged particle beam apparatus including: an irradiation optical system that irradiates a charged particle beam; a diffraction grating, provided on the downstream side of a traveling direction of the irradiated charged particle beam, that is formed of a material having permeability with respect to the charged particle beam; a sample holder that is capable of holding a sample on a diffraction surface of the diffraction grating; an image formation optical system that image-forms the charged particle beam passed through the diffraction surface; an image detector that detects image formation with the image formation optical system; and a controller that processes image data detected with the image detector, wherein the controller performs control to: make an opening region of the diffraction grating smaller than an irradiation region of the charged particle beam to the diffraction grating, with the irradiation region of the charged particle beam diffracted with the diffraction grating being within the irradiation region of the charged particle beam transmitted through the diffraction grating; and perform Fourier transform on plural holograms obtained based on the image data.

Figure 6:
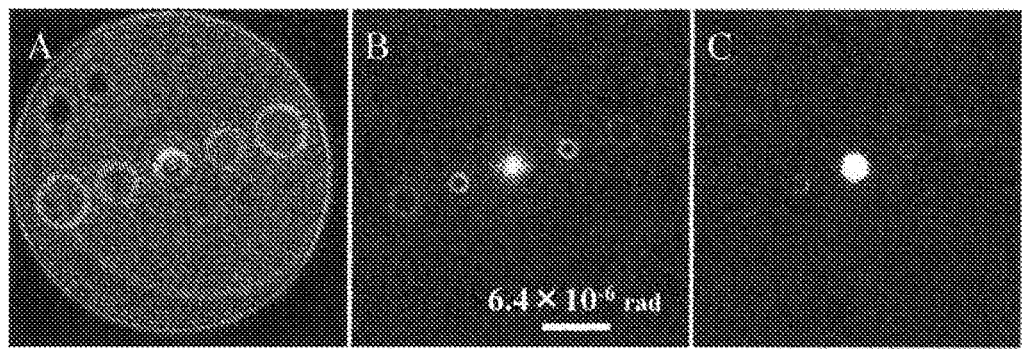
FIG. 6 is a diagram showing an example of the lensless Fourier transform holography according to Example 1.

FIG. 6 shows a reconstructed image by the lensless Fourier transform holography according to Example 1. In the lensless Fourier transform holography with the electron microscope described by using FIG. 1, since it is based on the diffraction method with the diffraction grating 16, plural holograms are recorded in a state where the same conditionalities and time simultaneity are sufficiently satisfied. That is, all the holograms are recorded on the same conditions, and it is considered that all the information is equivalent. Accordingly, in the present example, a reconstruction method for all the holograms on the same recording conditions will be described. In the figure, A is a hologram; B, a Fourier transform image (corresponding to a reconstructed image in the lensless Fourier transform holography); and C, an electronic diffraction image.

The result of the Fourier transform on all the hologram A of FIG. 6 as the same hologram as A of FIG. 4 is shown in B of FIG. 6. Further, an in-focus image of A as an electronic diffraction pattern is shown in C of FIG. 6. As apparent in the figure, B of FIG. 6 well corresponds to the image C. Further, B of FIG. 6 has a good SN ratio in comparison with C of FIG. 4, and the Bessel ring outside the ring-shaped diffraction spot is well observed. The respective ring-shaped diffraction spots, and the positions and the sizes of the Bessel rings outside the diffraction spots in B of FIG. 6 correspond to those in C of FIG. 6. From this fact, it is understood that in the lensless Fourier transform holography reconstruction method in the present example, reconstruction is performed with higher accuracy than that in the conventional technique.

Figure 7:
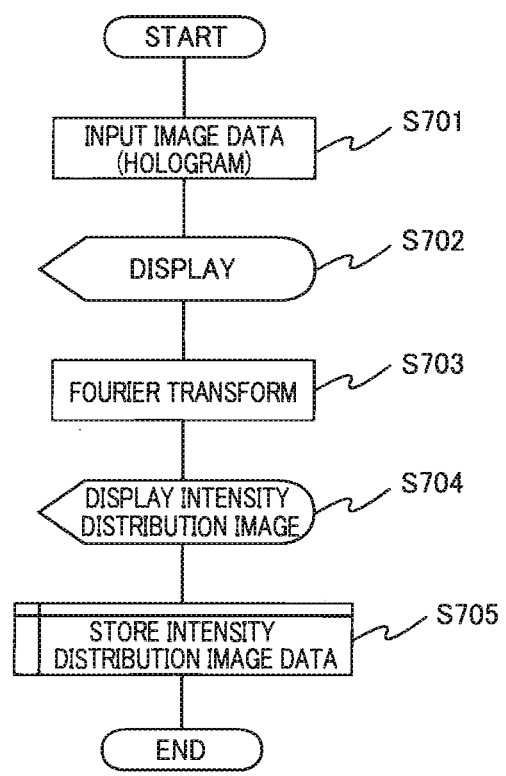
FIG. 7 is a diagram showing a flowchart of a procedure of the lensless Fourier transform holography reconstruction method according to Example 1.

FIG. 7 shows a flowchart (S701 to S705) of the procedure of the reconstruction method in the present example. First, data recorded as a hologram is inputted and displayed without any processing (S701 and S702). Then, the Fourier transform is performed on the hologram (S703). Then, from a real part and an imaginary part of the obtained calculation result, the reconstructed intensity distribution image B is obtained, displayed, and stored (S704 and S705).

In this manner, according to the lensless Fourier transform holography reconstruction method in Example 1, it is possible to improve the accuracy of a reconstructed image by comparing and referring to reconstructed images from plural holograms. Further, since the method is based on the diffracted wave, it is possible to arbitrarily perform separation of direct wave and conjugate wave upon hologram recording and separation of the direct wave and the conjugate wave upon reconstruction. That is, it is possible to reconstruct the following two waves:

(1) direct wave (upon recording)→direct wave (upon reconstruction)=phase distribution of direct wave, (2) conjugate wave (upon recording)→conjugate wave (upon reconstruction)=phase distribution of direct wave.

That is, since it is theoretically possible to reconstruct two direct waves recorded at completely the same time, it is possible to improve the accuracy of phase measurement by mutually comparing and referring to. Further, since the method is a reconstruction method as the lensless Fourier transform holography, it is possible to perform image reconstruction in a reciprocal space position and defocus correction. Further, in the configuration, it is also possible to implement the technique based on the Fourier transform reconstruction method as the conventional holography reconstruction method using a diffraction grating. Accordingly, it is possible to perform image reconstruction in hologram recording space. Further, it is possible to perform image reconstruction in the diffraction grating installation space by using the aberration correction method which is possible in the conventional reconstruction method. That is, according to the reconstruction method in the present example, it is possible to perform image reconstruction in three spaces with one hologram as described above.

Example 2

Example 2 is an example of the reconstruction method in which the previously described conventional Fourier transform reconstruction method is applied to a spiral wave. That is, the example is an example of the lensless Fourier transform holography reconstruction method in which the charged particle beam diffracted with the diffraction grating is the spiral wave, and the controller performs control to select some of the plural holograms and perform the Fourier transform on the selected holograms, select one of plural side bands in the obtained intensity distribution image, perform the Fourier inverse transform on the selected side band, and display the obtained amplitude distribution image and phase distribution image.

Figure 8:
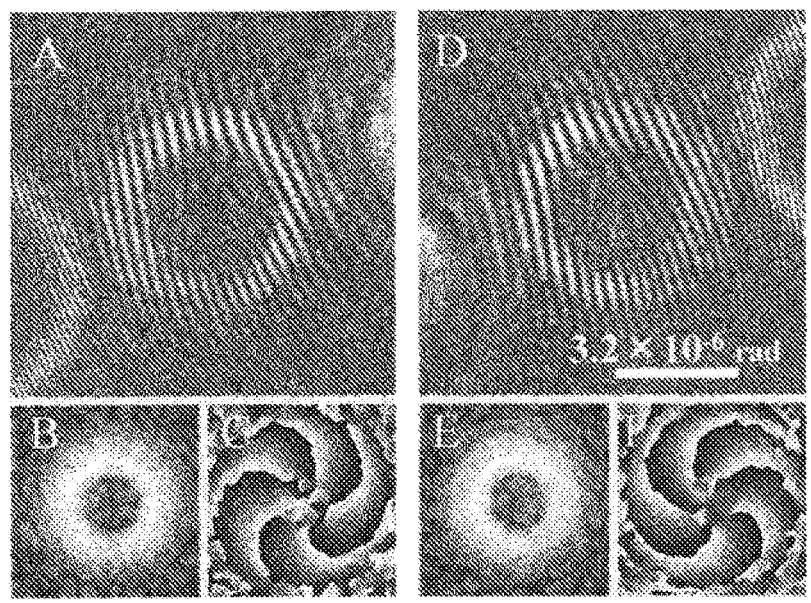
FIG. 8 is a diagram showing an example of holograms, reconstructed amplitude images and reconstructed phase images by the Fourier transform reconstruction method according to Example 2.

The hologram shown in A of FIG. 4 and FIG. 6, when a part of which is cut out as in the case in B of FIG. 4, has a similar form to the hologram by the conventional electron beam holography. That is, it is a shape where the interference fringes of the two waves, the diffracted wave and the transmitted wave from the diffraction grating, are modulated with the phase distribution of the wave transmitted through the object (that is, the wave corresponds to the diffracted wave in the present specification). In FIG. 4 and FIG. 6, the spiral wave corresponds to the object. That is, as shown in A of FIG. 4 and FIG. 6, it is an image where the interference fringes are superimposed on the ring-shaped image characteristic of the spiral wave. FIG. 8 shows the superimposed image as a hologram, together with the reconstruction result of execution of the conventional Fourier transform reconstruction method.

A of FIG. 8 is a hologram in which only the −1st order ring-shaped diffraction spot (−1st order diffraction spot on the left side in A of FIG. 4) is cut out. B of FIG. 8 is the reconstructed amplitude distribution image. C of FIG. 8 is the reconstructed phase image. The particular method of reconstruction is as described in FIG. 2. Upon reconstruction, the left side is selected as the side band after the Fourier transform. Note that it is necessary to use a determination method characteristic of the spiral wave for the determination of the central point of the side band, i.e., the origin of calculation processing upon reconstruction. This will be explained in Example 5 to be described later as a new calculation center determination method by the present inventors.

B of FIG. 8 has a ring-shaped distribution, and in C of FIG. 8, seen as a stream from the outside to the inside, has a clockwise winding shape. On the other hand, in the contrast (color density) indicating the phase distribution, white to black contrast modulation is repeated five times in clockwise circulation. It is understood that the wave is a spiral wave with a topological number of 5 (helicity 5). The amplitude distribution in B of FIG. 8 corresponds to the intensity distribution in A of FIG. 8. Accordingly, the intensity is almost lost at the ring center. However, the phase is reconstructed up to almost the center of the ring. This point also indicates the superiority of measuring a spiral wave in a phase distribution.

Regarding the +1st order ring-shaped diffraction spot, i.e., the +1st order diffraction spot on the right side in A of FIG. 4, hologram reconstruction is utterly similarly possible. D, E, and F of FIG. 8 show the hologram, the reconstructed amplitude distribution, and the reconstructed phase distribution, respectively. Note that at this time, the right side is selected as the side band after the Fourier transform upon reconstruction. This selection is made for matching the angular relationship between the object wave and the reference wave. That is, the selection is made for matching the left and right relationship between the object wave and the diffracted wave in A, B, and C of FIG. 8 and D, E, and F of FIG. 8.

Further, in the reconstructed phase distribution in F of FIG. 8, the contrast upon clockwise circulation is modulated from black to white. This contrast modulation is reversed in C of FIG. 8 and F of FIG. 8. This indicates that the winding shape of the reconstructed spiral wave is reversed, and that they are in the relationship in which, assuming that C of FIG. 8 upon recording is a conjugate wave, F of FIG. 8 is a direct wave.

The winding direction of the vortex is reversed between C and F of FIG. 8. This also indicates the relationship between the conjugate wave and the direct wave. Note that the winding direction of the vortex is reversed in accordance with positive/negative defocus upon hologram recording, i.e., the focus is moved above/below the diffraction surface. This depends on whether the spherical wave state of the transmitted wave used as a reference wave is upward convex (underfocus, i.e., on the upper side of the diffraction surface) or downward convex (overfocus, i.e., on the lower side of the diffraction surface). When the reference wave is a plane wave, a vortex distribution itself as shown in FIG. 8 does not occur in the phase distribution. The vortex occurs by defocus. The state where the vortex phase distribution disappears by defocus correction with respect to the diffraction surface will be described later in Example 4.

Hereinbelow, the procedure of the reconstruction method of the present example will be described with reference to a processing flowchart (S901 to S930) of FIG. 9A to FIG. 9C.
(1) A predetermined region of data recorded as a hologram is inputted and displayed (S901 and S902).
(2) A hologram is selected (A and D of FIG. 8) and moved to the calculation origin, then the Fourier transform is performed, and an intensity distribution image is displayed (S903 to S911).
(3) A side band is selected, then the center of a predetermined side band is extracted (S912 to S915). Note that the determination of the center (calculation center) of the side band (S915) will be described later using FIG. 14.
(4) The extracted center point of the side band is moved to the origin of the calculation processing (S916 to S919).
(5) The Fourier inverse transform is performed (S920).
(6) From the real part and the imaginary part of the calculation result, a reconstructed amplitude image (B and E of FIG. 8), a reconstructed phase image (C and F of FIG. 8), and a reconstructed intensity distribution image are obtained, displayed, and stored (S921 to S930).

Example 3

As Example 3, an example where the lensless Fourier transform holography is applied to a spiral wave, and the Fourier transform reconstruction method is applied to the hologram will be described. The present example is an example when the spiral wave is used as an observation object as in the case of Examples 1 and 2. Note that the observation object is not limited to the spiral wave.

Figure 10:
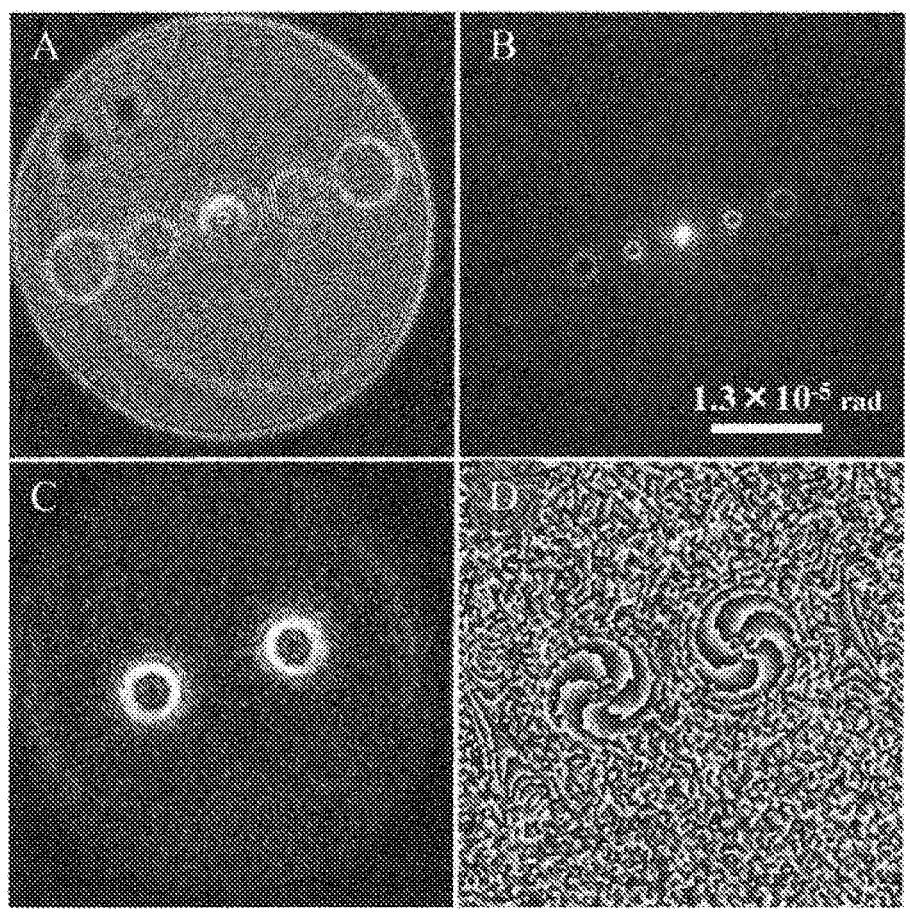
FIG. 10 is a diagram showing an example of the holograms, the reconstructed amplitude images, and the reconstructed phase images according to Example 3.

A of FIG. 10 is a hologram. The same 5th order edge dislocation grating used in FIG. 4 and FIG. 6 is used as a diffraction grating. As apparent in A of FIG. 10, the diffracted wave up to ±2nd order interferes with the transmitted wave, and the interference fringes are superimposed on the respective ring-shaped diffraction spots. The interval of the interference fringes reflects the angle between the diffracted wave and the transmitted wave. The interval of the interference fringes on the ±2nd order diffraction spot is ½ of the interval of the interference fringes on the ±1st order diffraction spot. Accordingly, even when the holograms of the ±1st and ±2nd order diffraction spots are handled together as an input image, it is possible to perform filtering (corresponding to mask processing in B of FIG. 4) to separate them upon reconstruction.

B of FIG. 10 is the Fourier transform image of A of FIG. 10. This Fourier transform image corresponds to the reconstructed image on the diffraction surface shown in Example 1. The reconstructed amplitude distribution image, obtained by, among four spiral wave diffraction patterns, selecting a +1st order Fourier transform spot (right side 1st order side band) as an example, then moving the pattern to the calculation origin, and performing the Fourier inverse transform, is indicated in C of FIG. 10, and the reconstructed phase distribution image, in D of FIG. 10. The amplitude distribution image in C of FIG. 10 has a ring-shaped distribution as in the case of the hologram in A of FIG. 10, and the image reconstructs the feature of the spiral wave. Further, the phase distribution image in D of FIG. 10 reconstructs up to almost the center of the ring as in the case of Example 2 shown in C of FIG. 8. Note that the phase distribution in D of FIG. 10, in which the white to black contrast modulation upon clockwise circulation about the center of the vortex contrast is repeated five times, indicates that it has a topological number of 5 (helicity 5).

The gradient of phase change (white to black color change direction) upon circulation about the center of the vortex contrast is clockwise both in the left and right two reconstructed phase images in D of FIG. 10, and the gradients correspond to each other. The cause of the correspondence will be briefly described below.

Assuming that the right side diffraction spot recorded in the hologram in A of FIG. 10 is a direct wave of the +1st order diffracted wave diffracted with the edge dislocation grating, the left side diffraction spot is a conjugate wave of the −1st order diffracted wave. It is supposed that the phase change was reversed in the two waves. Upon recording of the interference between the two waves and the transmitted wave, the left and right relationship between the diffracted wave and the transmitted wave is inverted. That is, in the right side +1st order diffracted wave, the waves are in the relationship where the right side to the drawing is the diffracted wave (object wave) and the left side is the transmitted wave (reference wave). In the left side −1st order diffracted wave, the waves are in the relationship where the left side to the drawing is the diffracted wave (object wave) and the right side is the transmitted wave (reference wave). When the waves are subjected to the Fourier transform together (B of FIG. 10), the −1st order diffracted wave is a conjugate wave. When the hologram of the conjugate wave is reconstructed, as a result of twice conjugation by selecting the side band (corresponding to the reconstructed wave) on the −1st order side, the phase distribution is returned to that of the direct wave. Accordingly, the gradients of the phase change in the reconstructed phase images in D of FIG. 10 correspond with each other in the left and right diffracted waves. That is, the two reconstructed waves in D of FIG. 10, including the amplitudes and phases, are utterly the same in principle. By mutually comparing and referring to using the two reconstructed phase images, it is possible to improve the accuracy in phase measurement.

Figure 11A:
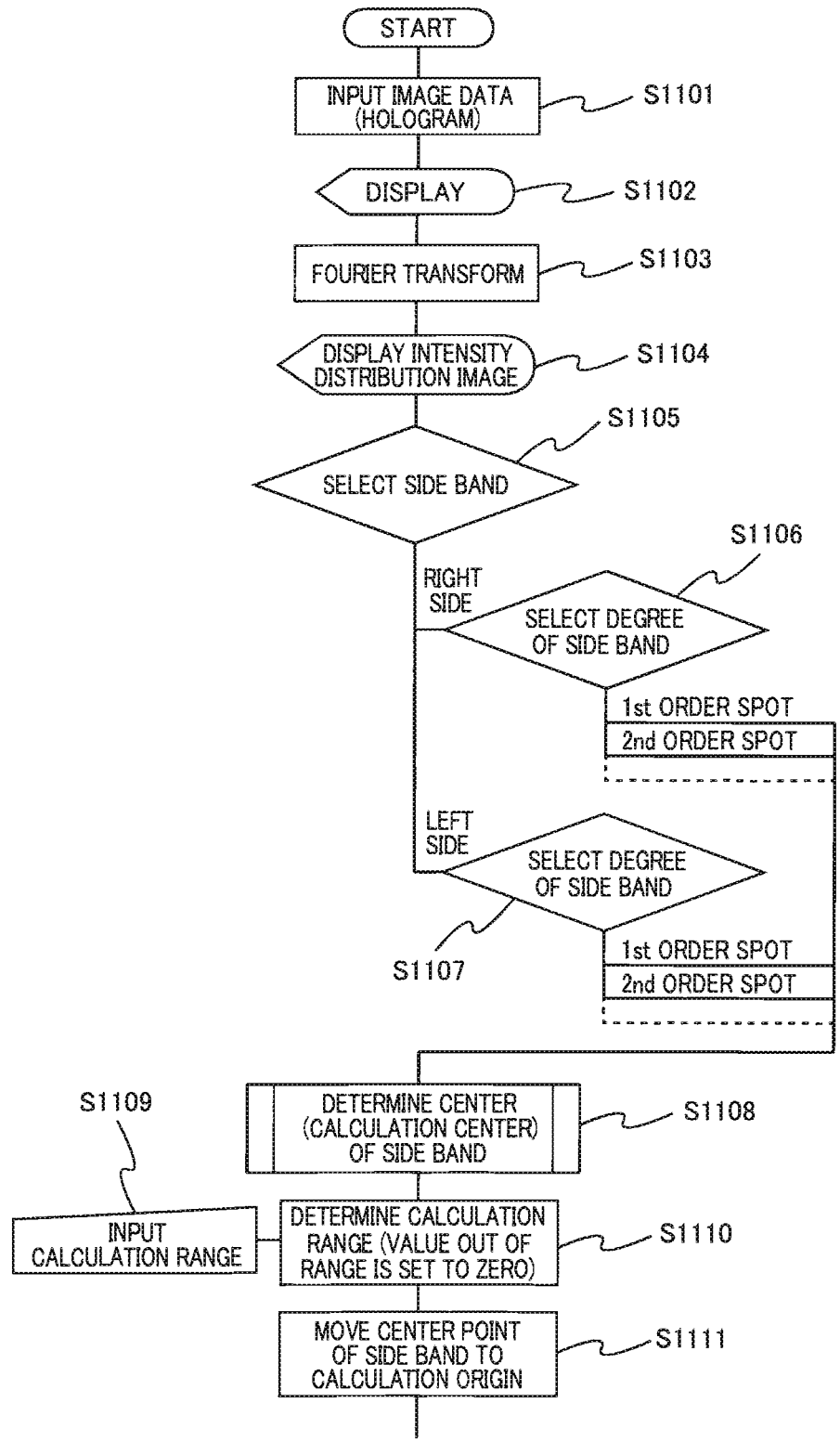
FIG. 11A is a diagram showing a processing flow of the lensless Fourier transform holography reconstruction method according to Example 3.
Figure 11B:
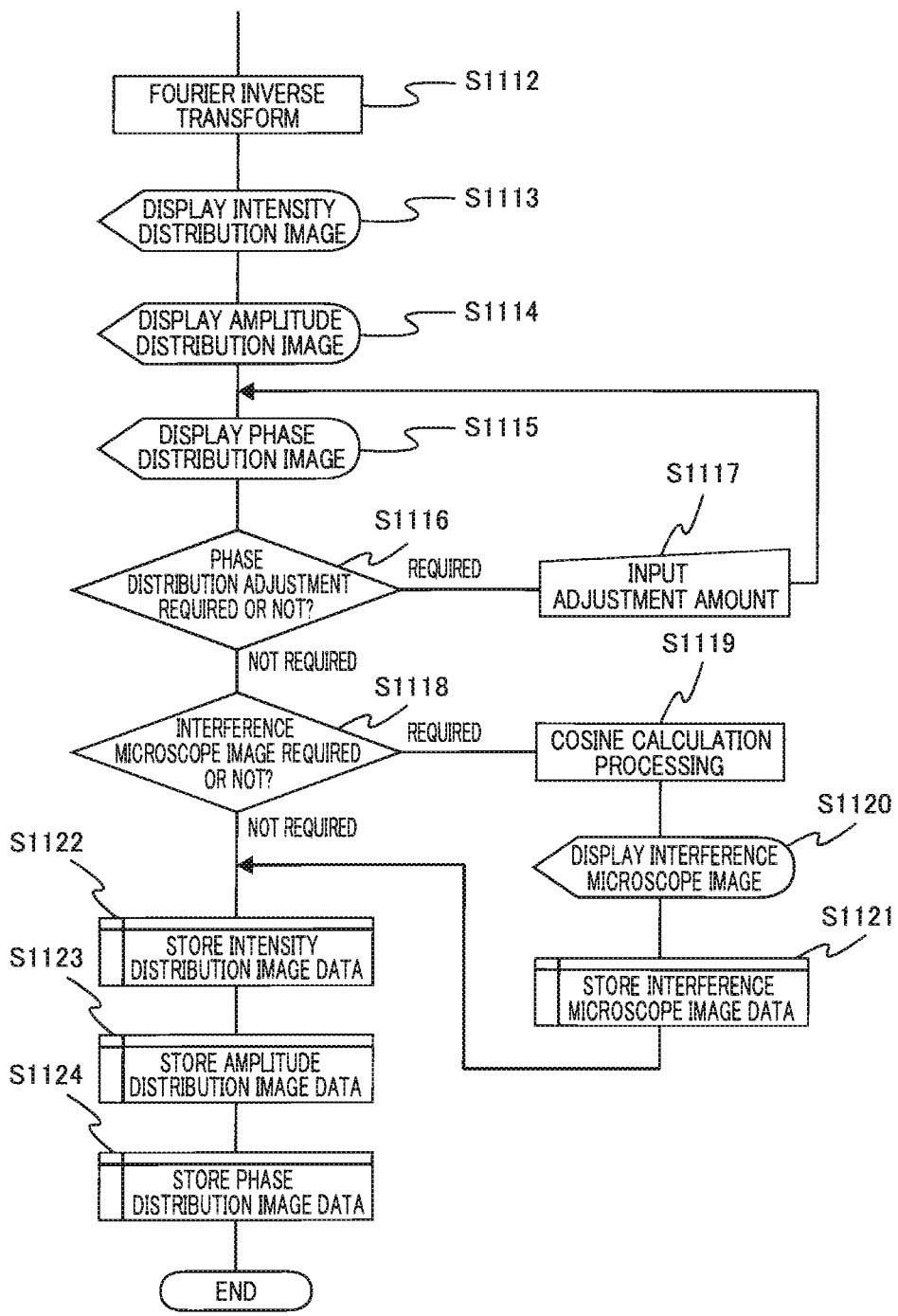
FIG. 11B is a diagram showing a processing flow (continued) of the lensless Fourier transform holography reconstruction method according to Example 3.

Hereinbelow, the procedure of the reconstruction method in the present example will be shown in the flowchart of FIG. 11A and FIG. 11B. A predetermined region of the data recorded as a hologram is inputted (S1101 and S1102).

The Fourier transform is performed. The reconstructed intensity distribution image in B of FIG. 10 is obtained on the diffraction surface (S1103 and S1104).

The center of a predetermined side band is extracted (S1105 to S1108).

The extracted center point of the side band is moved to the origin of the calculation processing (S1109 to S1111).

The Fourier inverse transform is performed (S1112), and from the real part and the imaginary part of the calculation result, it is possible to obtain the reconstructed amplitude image of C, the reconstructed phase image of D, and the reconstructed intensity distribution image in FIG. 10 (S1113 to S1124).

Example 4

Example 4 is an example of the lensless Fourier transform holography reconstruction method capable of defocus correction from the diffraction surface. In the hologram in the previously-described respective examples, to superimpose the 0 order transmitted wave and the spiral wave (diffracted wave), defocus from the diffraction surface was essential. With this defocus, in the reconstructed wave (reconstructed image) reconstructed in Example 2 and Example 3, the electronic wave is faithfully reconstructed on the surface where the hologram is recorded, but the wave is not a diffraction surface, and not a surface on which the diffraction grating is installed.

Regarding the diffraction surface, it is possible to reconstruct both of the amplitude distribution and the phase distribution in accordance with Example 1. On the other hand, also regarding the surface provided with the diffraction grating, it is possible to perform reconstruction by using the aberration correction method in the conventional electron beam holography. In this technique, regarding modulation applied to the amplitude distribution and the phase distribution with defocus, spherical aberration, astigmatism or the like, a theoretical formula of high approximation is given. For example, Scherzer expression or the like is given. The method is performing correction or addition on the modulation of the amplitude distribution and the phase distribution of aberration, defocus or the like recorded in the hologram, by performing deconvolution on a mathematical filter function using this expression, prior to execution of the Fourier inverse transform, in the reconstruction method by the Fourier transform method.

Figure 12:
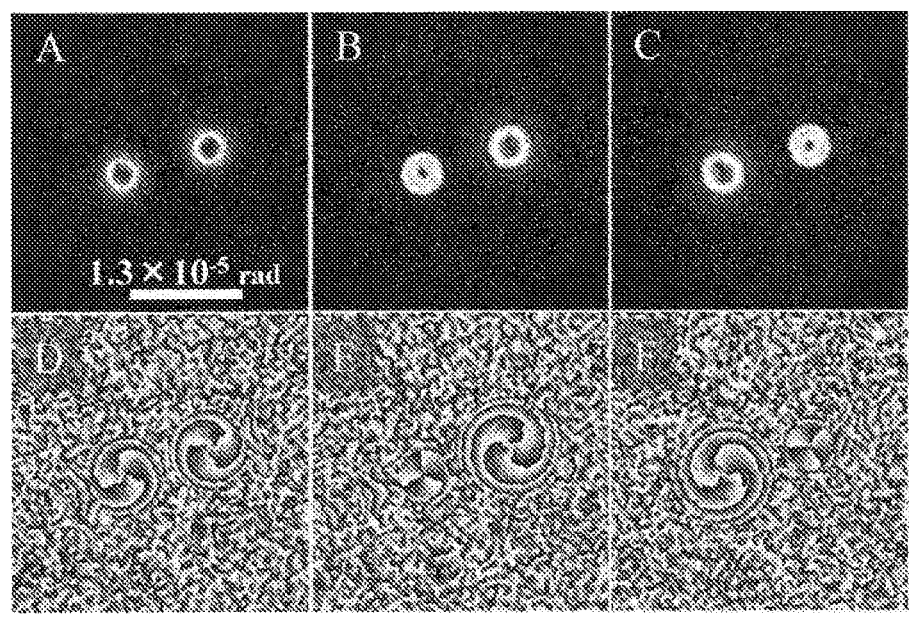
FIG. 12 is a diagram for explaining a Fourier transform holography reconstruction method capable of defocus correction from a diffraction surface according to Example 4.
Figure 13A:
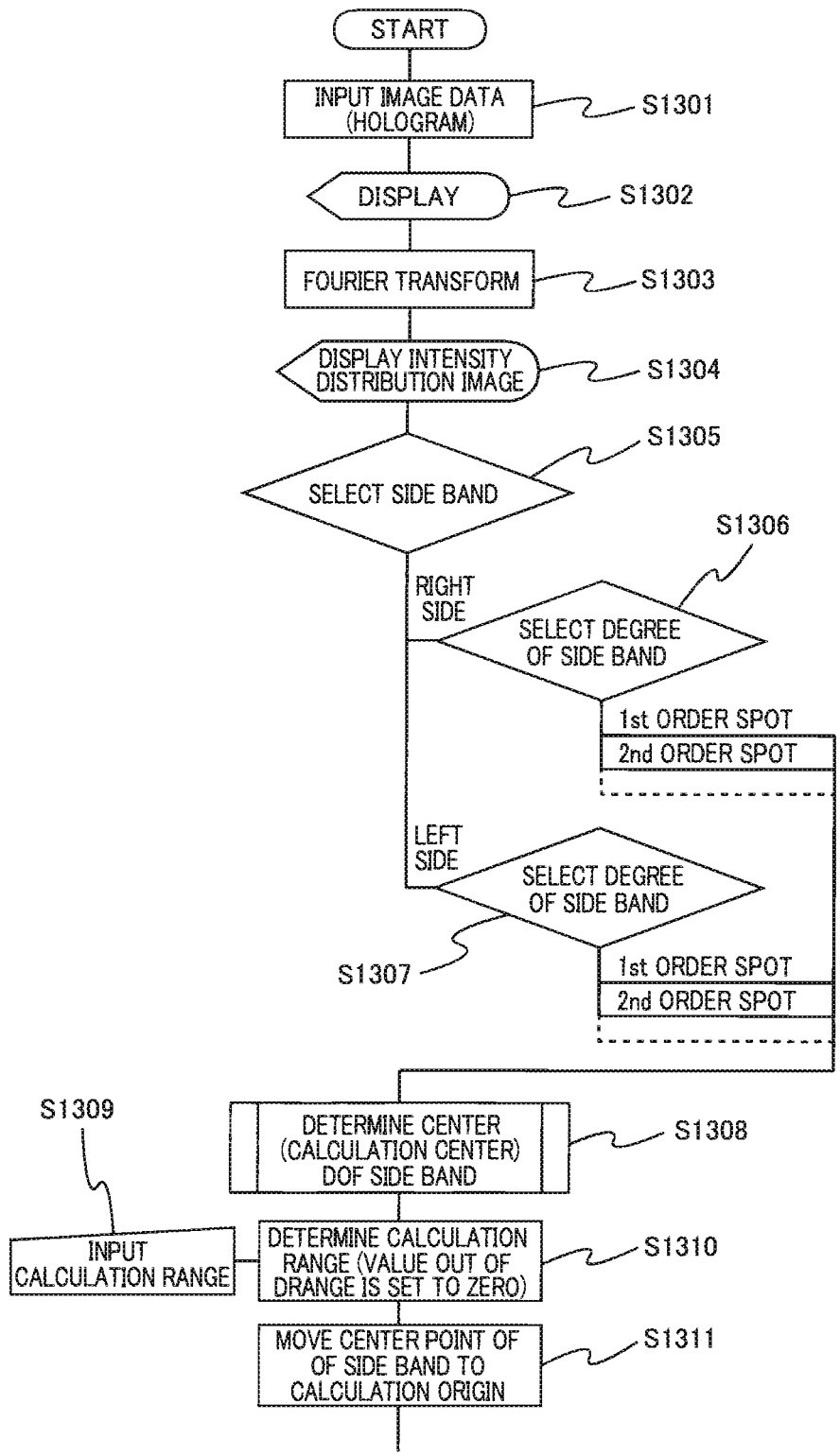
FIG. 13A is a diagram showing a processing flow of the lensless Fourier transform holography reconstruction method according to Example 4.
Figure 13B:
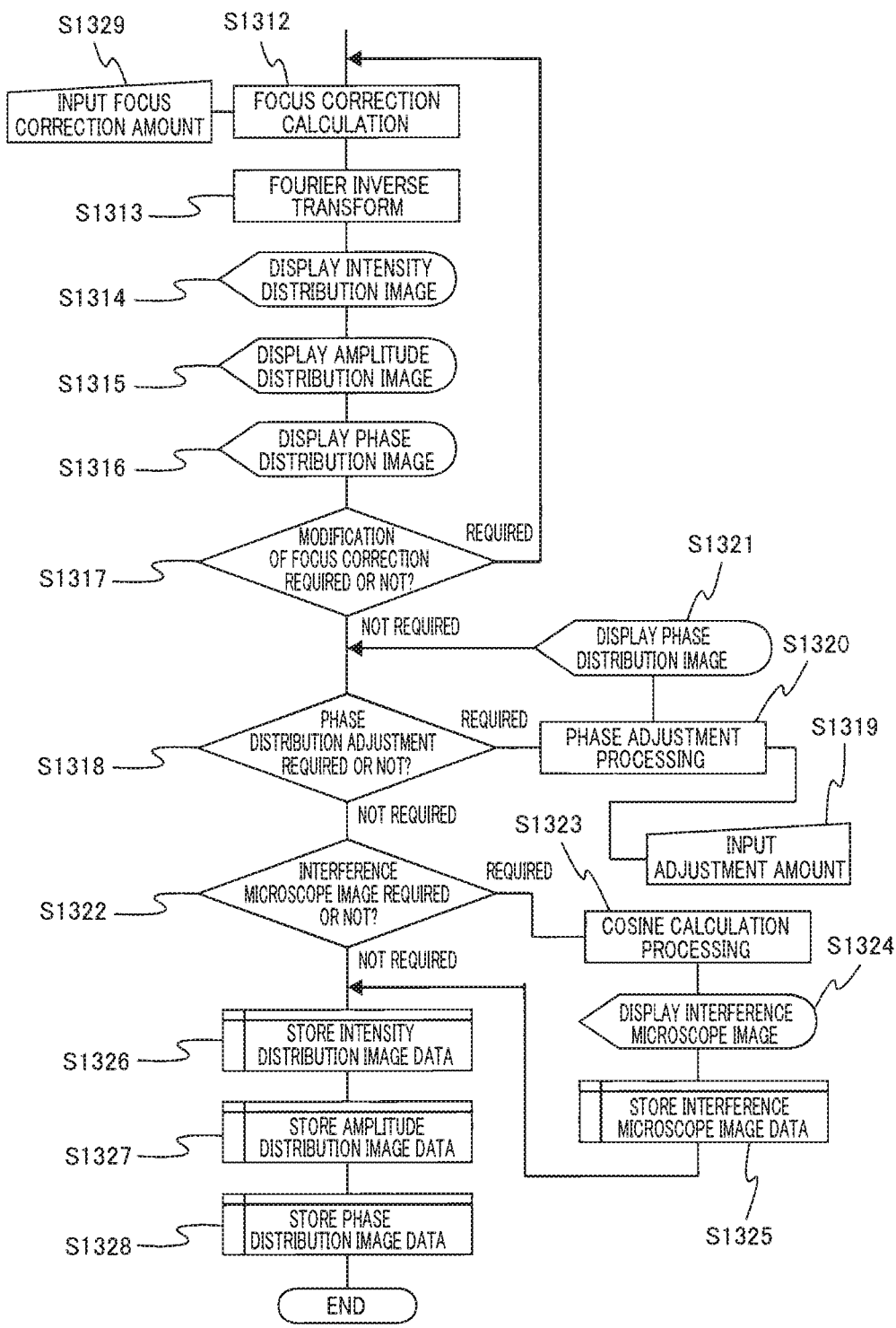
FIG. 13B is a diagram showing a processing flow (continued) of the lensless Fourier transform holography reconstruction method according to Example 4.

FIG. 12 shows the reconstructed amplitude distribution (upper stage in the figure) as a reconstruction wave field on the diffraction surface by the defocus correction method of the present example and the reconstructed phase distribution (lower stage in the figure). FIG. 13A and FIG. 13B are a flowchart showing a processing flow of the reconstruction method of Example 4. The lower stage phase distribution in FIG. 12, in which the white to black contrast modulation upon clockwise circulation about the center of the vortex contrast is repeated three times, indicates that it has a topological number of 3 (helicity 3). Unlike the examples up to Example 3, upon generation of the hologram in FIG. 12, a 3rd order edge dislocation grating is used as the diffraction grating.

A of FIG. 12 is a reconstructed amplitude distribution image in a hologram recording position. B of FIG. 12 is a reconstructed amplitude image where the surface provided with the diffraction grating is focused regarding the left side diffracted wave. C is a reconstructed amplitude image where the surface provided with the diffraction grating is focused regarding the right side diffracted wave. D, E, and F in the figure are reconstructed phase images. A and D of FIG. 10 are not defocus corrected; in B and E, the left spot is corrected; and in C and F, the right spot is corrected.

Figure 9B:
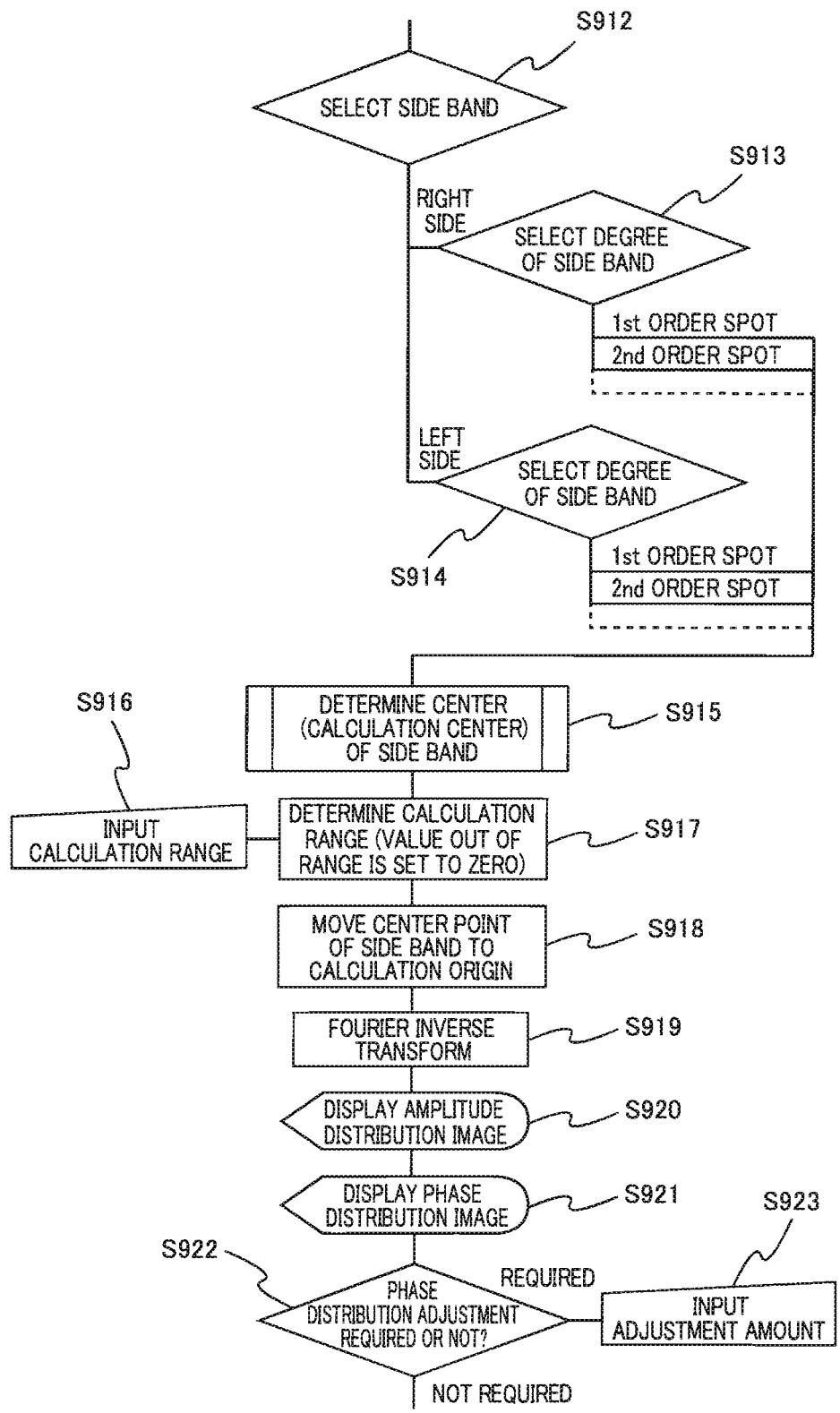
FIG. 9B is a diagram showing a processing flow (continued) of the Fourier transform holography reconstruction method according to Example 2.
Figure 9C:
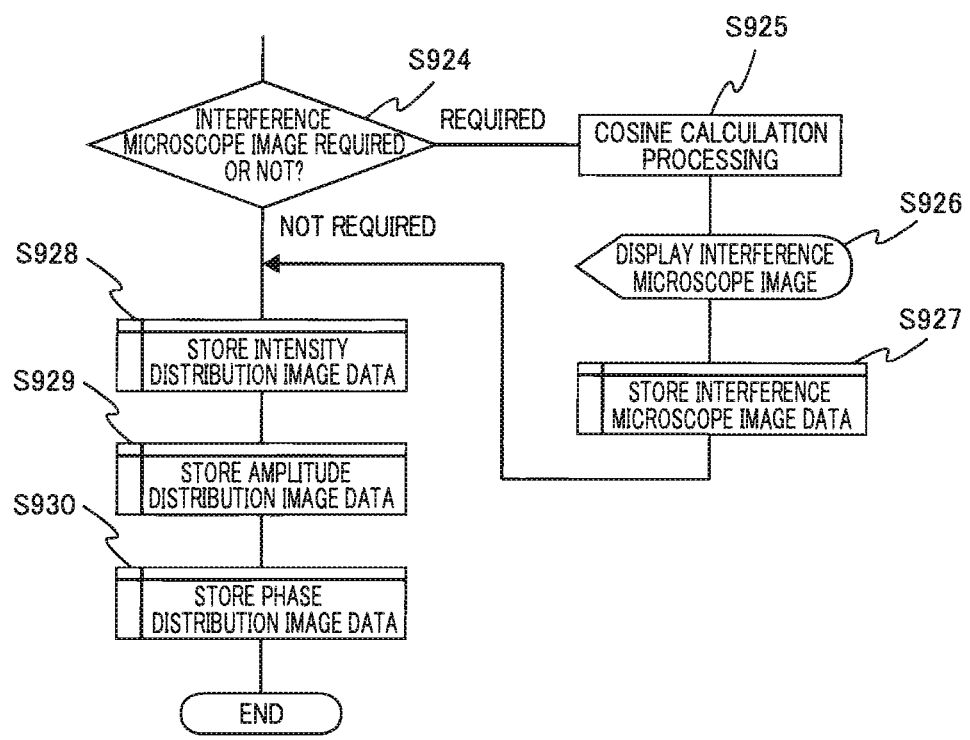
FIG. 9C is a diagram showing a processing flow (continued) of the Fourier transform holography reconstruction method according to Example 2.

In the flowchart of FIGS. 13A and 13B, the explanation of S1301 to S1311 overlaps with the explanation of S910 to S918 in FIG. 9A and FIG. 9B, accordingly, the explanation will be omitted. In the present example, when it is determined that the focus correction is required, a focus correction amount is inputted, then the focus correction calculation is performed (S1329 and S1312), and the intensity distribution image, the amplitude distribution image, and the phase distribution image are displayed (S1314 to S1316). Then it is determined whether or not correction of the focus correction is required (S1317). When it is required, the correction is performed, and the following processing (S1318 to S1328) is performed. Since the processing is the same as that at S922 to S930, explanation of the processing will be omitted.

In the present example, when the correction is performed, as it is a conjugate wave, in the opposite spot, the defocus is further increased. That is, since the left and right diffracted waves are in mutual conjugate relationship as previously described, when the defocus of one of the waves is corrected, the defocus amount of the other wave is increased by the same amount. The increase of the defocus amount is apparent because the amplitude image and the phase image are both observed in a bigger size due to image blur by the large amount of defocus. Note that both in B and C of FIG. 12, the center of the amplitude image is black even after the defocus amount correction, because this is a core of the spiral wave to which the intensity of the wave has not been propagated. In the spiral wave, the intensity of the core most indicating the spirality of the wave surface is extremely small, which causes a problem when the practical use of the spiral wave is considered. Since both of the phase and the amplitude are recorded in the hologram, it is possible to reconstruct an arbitrary defocus amount, i.e., the wave surface in an arbitrary position in the space where the spiral wave is propagated, later, as described in the present example.

Example 5

The present example is an example of the lensless Fourier transform holography reconstruction method for high accuracy reconstruction of the spiral wave. Particularly, the example relates to the side band extraction method upon hologram reconstruction described in Examples 2 and 3, and the side band center (calculation center) determination method at S915, S1108 and the like.

Upon extraction of one of the side bands, the point greatly different from the conventional reconstruction method from the hologram is that the calculation center (calculation origin) upon extraction is not determined. When the calculation center is shifted from the center of the side band, a large change appears in the reconstructed phase image. That is, since the rotation center of the phase of the spiral wave is shifted, a distorted vortex reconstructed phase image is obtained. That is, there is a possibility that a large artifact is introduced in the reconstructed image by the calculation processing. An ideal reconstructed phase image has a shape equiphase-shifted by azimuth angle from the center of a spiral wave. The reconstructed phase image in FIG. 8, FIG. 10, and FIG. 12 has the shape equiphase-shifted by azimuth angle from the center of a spiral wave, and is an almost ideal reconstructed image.

As the way of determination of the center point of the side band, conventionally, a pixel having the maximum intensity of the side band (or a sub pixel unit by image processing) was determined as the side band center upon reconstruction calculation. In the case of a spiral wave, the side band has a ring shape and is not at a maximum intensity. As a result of interference from respective points of the ring shape, the intensity is offset. Accordingly, theoretically, selection of a minimum intensity point in contrast to the conventional method may be possible.

However, as the influence of noise strongly appears at a low intensity, it is not practical in actual experiments. Further, since a diffracted wave after irradiation of the sample with the spiral wave contains sample information, it may not necessarily have a ring shape with good symmetry. Accordingly, considering an application for actual sample observation, it is not realistic to determine a pixel at the minimum intensity as the calculation center.

Figure 14:
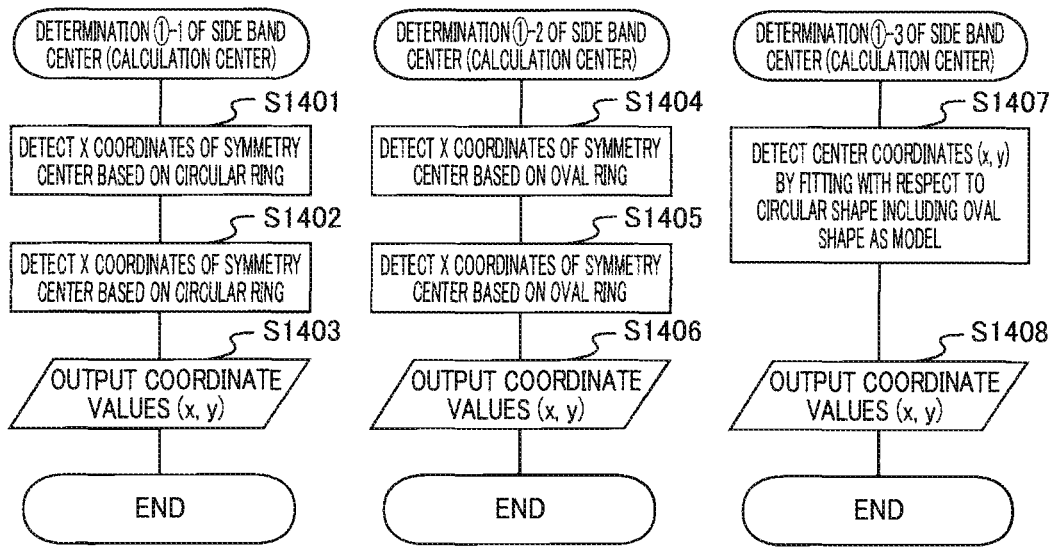
FIG. 14 is a diagram showing a processing flow of side band center (calculation center) determination according to the respective examples and Example 5.
Figure 14:
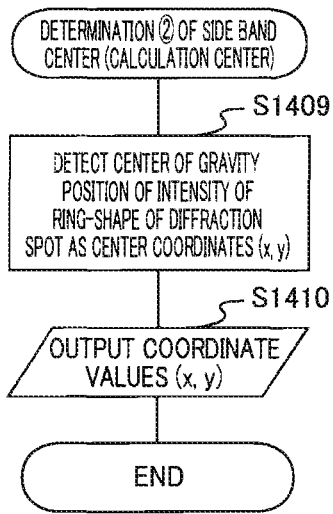
Figure 14:
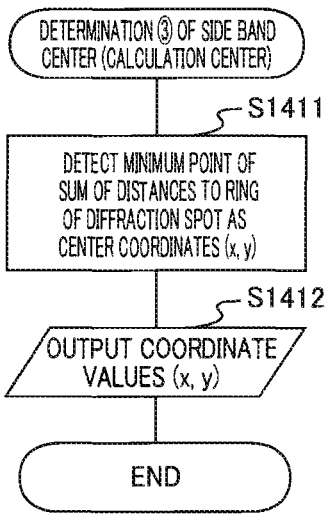
Figure 14:
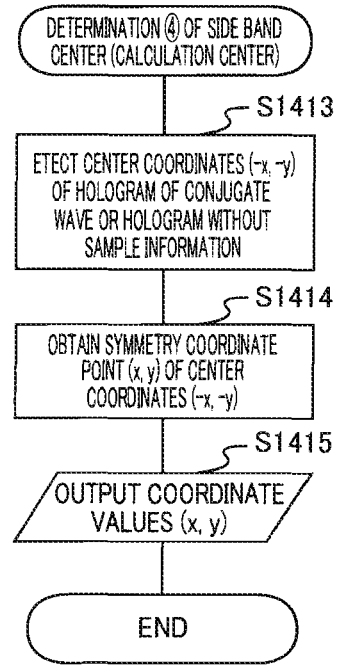

The simplest method for determining the calculation center of the side band is (1) a method of determining a symmetry center of the ring shape as the calculation center, as shown in (a) of FIG. 14. When the ring has a circular shape (S1401 to S1403), or an oval shape (S1404 to S1406), or a slight shift in the case of a shape slightly out of these shapes, the center position is determined based on circular shape (including the oval shape) fitting (S1407 to S1408).

In addition, various methods may be considered. For example, as shown in (b) and (c) of FIG. 14, it is possible to calculate to obtain (2) the center point of gravity of the ring intensity (S1409 and S1410), (3) a minimum sum point of distances to the ring (S1411 and 1412), and the like. None of the methods is difficult in the present computer and the calculation processing technology.

Example 6

The present example is an example of a high accuracy reconstruction method using a reference hologram. That is, it is an example where one of positive/negative diffraction spots of the diffracted charged particle beam, as a spiral wave, is irradiated to the sample placed on the diffraction surface of the diffraction grating, then the hologram by the other diffraction spot is subjected to the Fourier transform, and the center of the side band is determined. When the calculation center is determined by any of the methods in Example 5, the phase distribution image is obtained. However, since there is no precedent of the state of the interaction between the spiral wave and the sample, what type of interaction occurs, and how the phase of the incident spiral wave is modulated as a result of the interaction, are not well known yet. Accordingly, as shown in (d) of FIG. 14, the method of obtaining the calculation center by utilizing a hologram of the conjugate wave (S1413 to S1415) is preferable.

Figure 15:
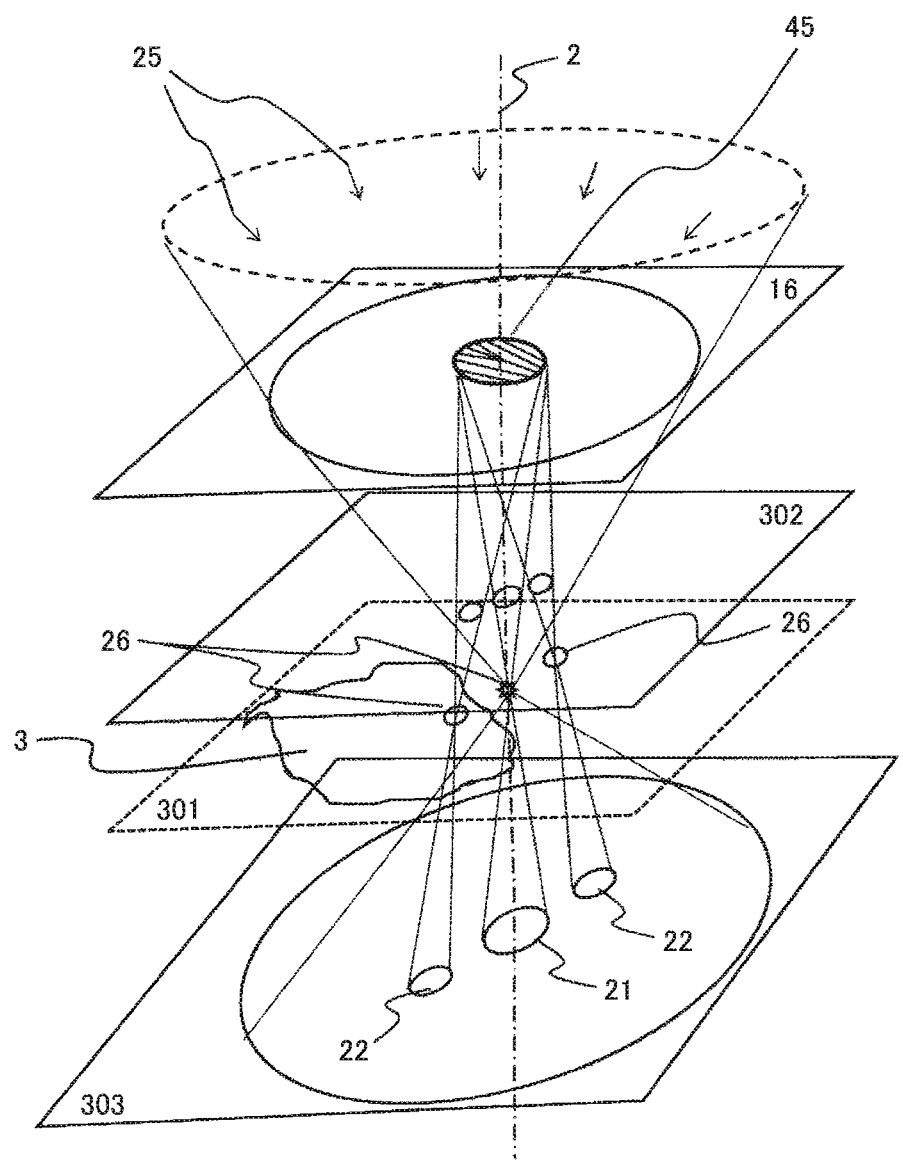
FIG. 15 is a schematic diagram for explaining the lensless Fourier transform holography according to Example 6.

As shown in FIG. 15, one of the positive/negative diffraction spots is used as the spiral wave irradiated to the sample 3. In FIG. 15, the left side spot 26 will be referred to as a conjugate spiral wave irradiated to the sample, and the right side spot 26, as a direct spiral wave. Note that in the conjugate wave, the phase information of the irradiation spiral wave in which the interaction with respect to the sample 3 is not recorded, is recorded. Only the hologram obtained with the right side spot (right ring) is extracted then subjected to the Fourier transform, then, the calculation center is obtained by the previously described method, and is applied to the Fourier transform pattern of the hologram interacted with the sample (left ring). Since the Fourier transform is symmetrical to the origin, it can be implemented.

Further, in addition to the determination of the calculation origin of the object wave hologram using the conjugate wave hologram, the phase distribution directly reflecting the incident spiral wave is reconstructed from the conjugate wave hologram. By obtaining the difference between the wave surface and the phase distribution of the object wave interacted with the sample, it is possible to reconstruct the state of the interaction between the sample and the spiral wave, with high accuracy, and as reliable processing.

Note that when the conjugate wave hologram and the object wave hologram are simultaneously reconstructed by the Fourier transform method in accordance with the reconstruction method of Example 2, reverse does not occur in the phase distribution of the direct wave and the phase distribution of the conjugate wave. Accordingly, it is possible to immediately obtain the difference between the phase components of the two waves. By using the above method, in the reconstruction method of this embodiment, it is possible to obtain the phase modulation of a spiral wave with high accuracy and high reliability experimentally, even without simulation.

Hereinbelow, the procedure of the reconstruction processing using the calculation center obtained by utilizing the conjugate wave hologram in the present example will be described using flowcharts of FIG. 16A, FIG. 16B, FIG. 17A, and FIG. 17B. First, a subroutine to obtain the side band center point (calculation center) shown in the flowchart of FIG. 16A and FIG. 16B will be described. This subroutine corresponds to the determination of the side band center (calculation center) of FIG. 17A (S1705).

Figure 16A:
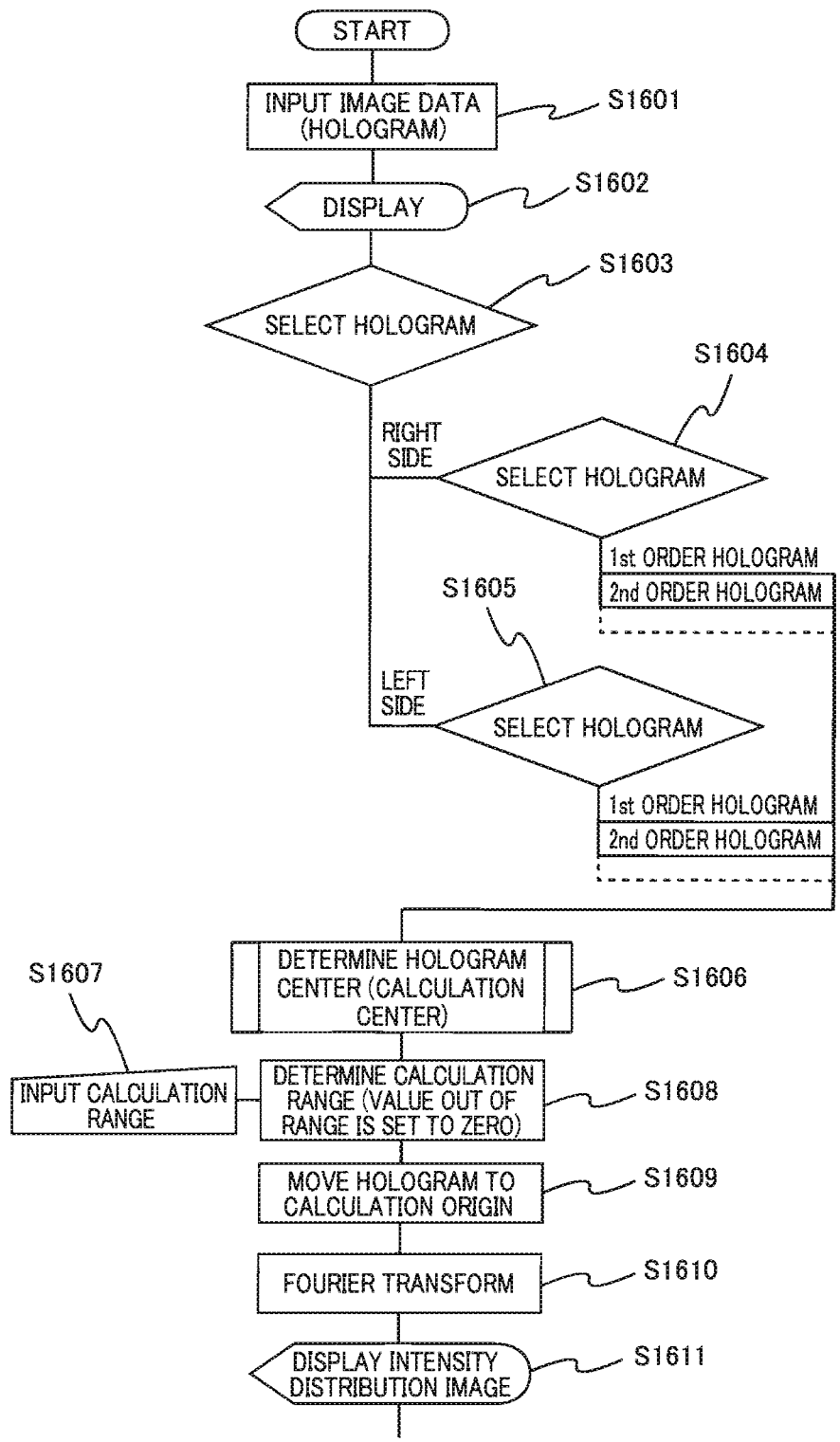
FIG. 16A is a diagram showing a subroutine of the lensless Fourier transform holography reconstruction method according to Example 6.
Figure 16B:
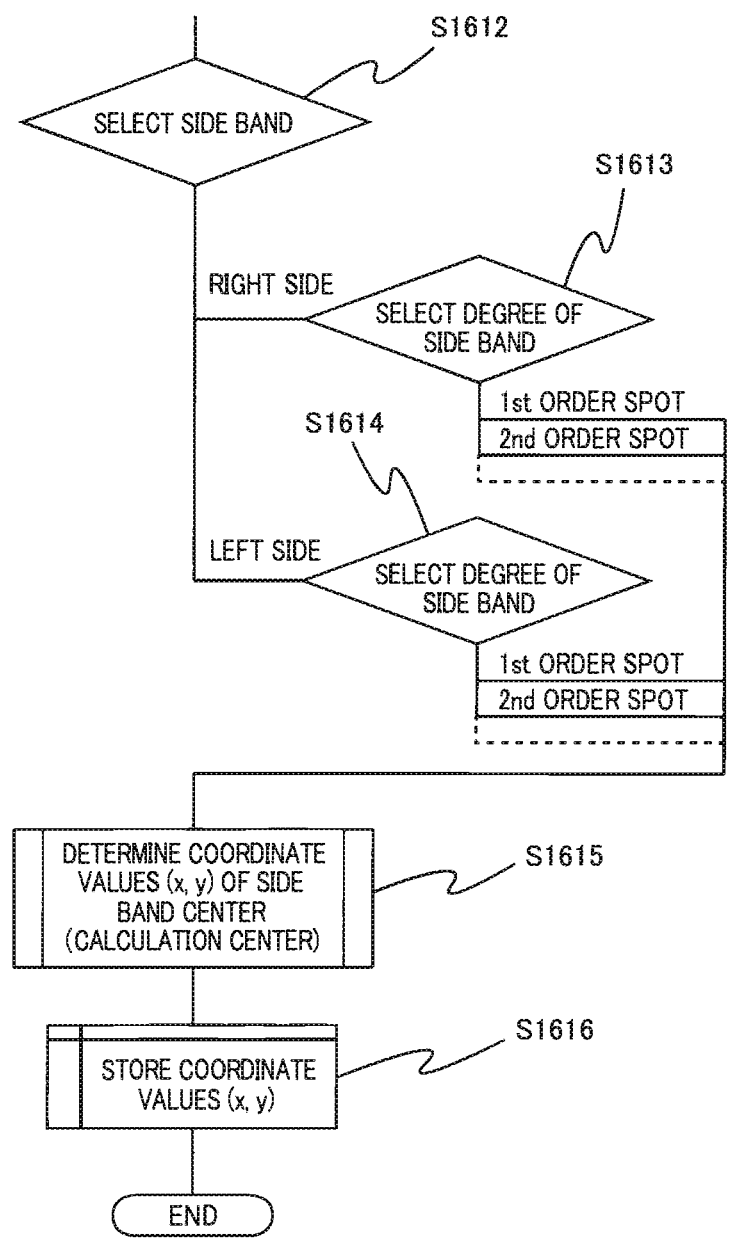
FIG. 16B is a diagram showing a subroutine (continued) of the lensless Fourier transform holography reconstruction method according to Example 6.

In FIG. 16A, (1) data in which plural holograms are recorded is inputted into a computer and displayed (S1601 and S1602). (2) In the input image data, image data in which only a region of a reference hologram is left and the other data is deleted is generated (S1603 to S1609). (3) Only this reference hologram is subject to the Fourier transform, to obtain a ring-shaped diffraction pattern (S1610 and S1611). (4) The obtained ring-shaped diffraction pattern is made with the spiral wave which transmitted only through the space and was not modulated, and accordingly, the pattern must have an ideal perfect circular shape. (5) By circular-shape fitting with this ring-shaped pattern, the ring center, i.e., coordinate values (x, y) of the side band center (calculation center) are mathematically obtained and recorded (S1612 to S1616). The calculation accuracy at this time is more preferable as it is higher. For example, the accuracy is ¹⁄₁₀ of the pixel, and processing is performed by sub pixel. The ring center obtained here is the calculation origin in the reconstruction processing of the present example described next (S1705 in FIG. 17A).

Figure 17A:
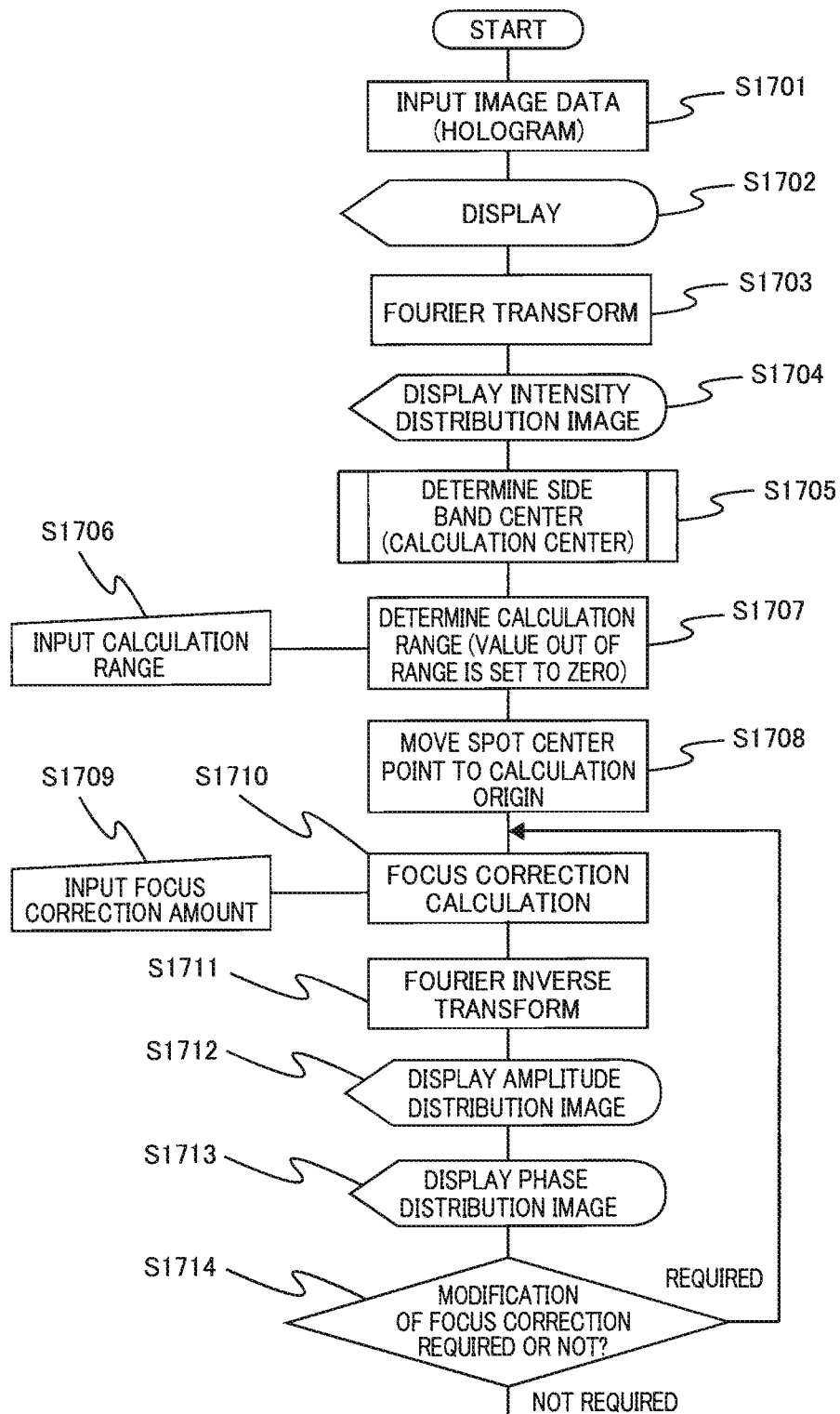
FIG. 17A is a diagram showing a processing flow of the Fourier transform holography reconstruction method according to Example 6.
Figure 17B:
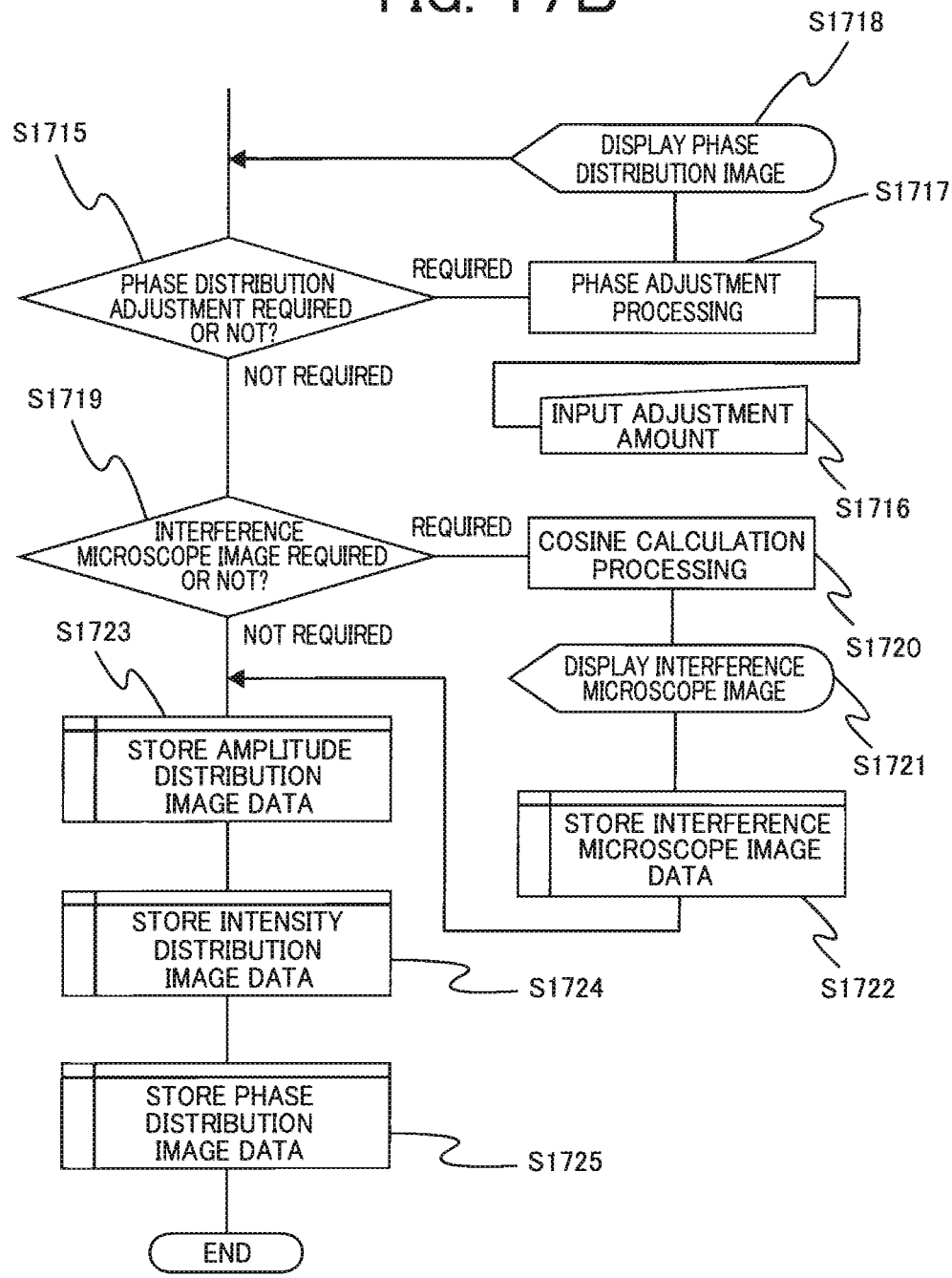
FIG. 17B is a diagram showing a processing flow (continued) of the Fourier transform holography reconstruction method according to Example 6.

The reconstruction processing of the original hologram is performed in accordance with the processing flow of FIG. 17A and FIG. 17B. (6) Data in which plural holograms are recorded is inputted into the computer (S1701 and S1702, and the above-described (1) is repeated). (7) After execution of the Fourier transform, with the ring center obtained in the above-described (5) as the origin of the calculation processing, the reconstruction processing is continued (S1706 to S1708). Note that the processing at S1709 to S1725 is the same as that at S1312 to S1329 in FIG. 13B, accordingly, the explanation will be omitted.

In the present example, (8) regarding the direct wave hologram, the direct wave is reconstructed, and regarding the conjugate wave hologram, the conjugate wave is reconstructed. That is, two reconstructed waves are obtained at once. (9) Regarding the above-described two reconstructed waves, especially the phase distribution (S1725), it is possible to know the phase modulation which the object gave to the spiral wave (direct wave) by comparing and referring to the reconstructed phase distributions. (10) The obtained phase modulation is rewritten with separate knowledge into physical information, and the high accuracy physical property measurement with a spiral wave is completed.

Example 7

As described previously, in the spiral wave, also in the ring-shaped diffracted wave, or the defocus-corrected reconstructed image in FIG. 12, the intensity at the center of the amplitude distribution is extremely low. Even when the phase is obtained, there is a possibility that it is difficult to practically use the phase.

Figure 18:
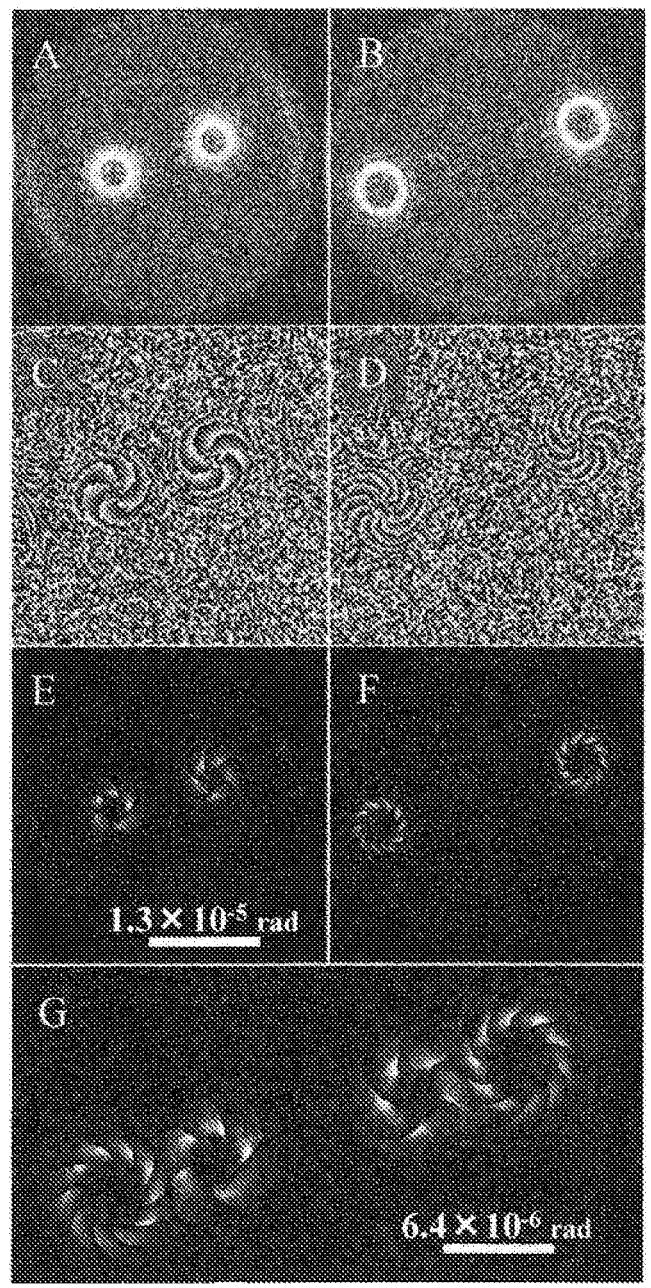
FIG. 18 is a diagram for explaining a sum of reconstructed images according to Example 7.

Accordingly, in Example 7, to clarify the available range of phase distribution, it is rational to utilize a summed image of the amplitude distribution in A and B of FIG. 18 and the phase distribution of C and D of FIG. 18. E and F of FIG. 18 are summed images of the amplitude distribution and phase distribution. As apparent in E and F of FIG. 18, the vortex phase distribution image is superimposed on the ring, and the phase distribution obtainable range is displayed like a twisted string, with the phase value.

Further, in the hologram described in the present example, the interval of the interference fringes is twice different between the ±1st order and ±2nd order diffracted waves. Accordingly, even when four holograms are simultaneously inputted, as the spatial frequency filtering is simultaneously performed in the Fourier transform method, it is possible to obtain reconstructed images respectively. Then, to obtain a reconstructed image of an entire input hologram, it is necessary to sum the obtained reconstructed images. This example is also shown as G of FIG. 18.

According to the lensless Fourier transform holography as described above in detail and the holography reconstruction method of the present invention, it is possible to realize a technique as a combination of an electronic spiral wave and electron holography, which has not been realized in the conventional electron holography. It is possible to obtain a lot of effective information.

Note that the above-described various examples have been described for better understanding of the present invention, and the present invention is not necessarily limited to an embodiment having all the described constituent elements. Further, some of constituent elements of an example may be replaced with those of another example. Further, constituent elements of an example may be added to another example. Further, it is possible to perform addition/deletion/replacement with respect to some of constituent elements of the respective examples with other constituent elements.

Further, examples of use of a system control computer, on which a program to realize some or all the respective constituent elements, functions, controllers and the like, operates, have been described. It goes without saying that some or all of them may be realized with hardware by designing as e.g. an integrated circuit. That is, all or some of functions of the controller may be replaced with a program, and realized with an integrated circuit or the like such as an ASIC (Application Specific Integrated Circuit) or an FPGA (Field programmable Gate Array).

REFERENCE SIGNS LIST 2, 1902 . . . optical axis
3, 1903 . . . sample
16, 1935 . . . diffraction grating
21 . . . transmitted wave
22 . . . diffracted wave
25 . . . incident particle beam
26 . . . crossover, spot
35 . . . white portion
36 . . . side band
45 . . . edge dislocation grating
301 . . . diffraction surface
84 . . . interference fringes
301 . . . diffraction surface
302 . . . underfocus surface
303 . . . overfocus surface
1901 . . . electron gun or particle source
1904 . . . charged particle beam apparatus
1905 . . . objective lens 1908 . . . final image
1938 . . . diffraction grating control unit
1939 . . . sample holding device control unit
1940 . . . acceleration tube
1941 . . . first condenser lens
1942 . . . second condenser lens
1947 . . . second condenser lens control unit
1948 . . . first condenser lens control unit
1949 . . . acceleration tube control unit
1951 . . . system control computer
1952 . . . monitor
1953 . . . interface
1959 . . . objective lens control unit
1961 . . . first imaging lens
1962 . . . second imaging lens
1963 . . . third imaging lens
1964 . . . fourth imaging lens
1966 . . . fourth imaging lens control unit
1967 . . . third imaging lens control unit
1968 . . . second imaging lens control unit
1969 . . . first imaging lens control unit
1975 . . . observation recording surface
1976 . . . image data monitor
1977 . . . image data recorder
1978 . . . image data controller
1979 . . . image detector

The invention claimed is:

1. A holography reconstruction method comprising:
irradiating a sample on a diffraction surface of a diffraction grating with a charged particle beam;
making an opening region of the diffraction grating smaller than an irradiation region of the charged particle beam to the diffraction grating, with the irradiation region of the charged particle beam diffracted with the diffraction grating being within the irradiation region of the charged particle beam transmitted through the diffraction grating;
detecting an image formed using the charged particle beam passed through the diffraction surface;
selecting at least one of a plurality of holograms obtained based on image data associated with the detected image; and
performing a Fourier transform on the selected hologram,
wherein the diffraction grating is formed of a material having permeability with respect to the charged particle beam.

2. The holography reconstruction method according to claim 1,
wherein the charged particle beam diffracted with the diffraction grating is a spiral wave.

3. The holography reconstruction method according to claim 2,
wherein said selecting at least one of a plurality of holograms obtained based on image data associated with the detected image further comprises:
selecting some of the plurality of holograms;
performing the Fourier transform on the holograms;
selecting one of a plurality of side bands in an obtained intensity distribution image; and
performing a Fourier inverse transform on the selected side band, and display an obtained amplitude distribution image and a phase distribution image.

4. The holography reconstruction method according to claim 1,
wherein said selecting at least one of a plurality of holograms obtained based on image data associated with the detected image further comprises:
performing the Fourier transform on the plurality of holograms;
selecting one of side bands of an obtained intensity distribution image;
performing a Fourier inverse transform on the selected side band; and
displaying an obtained amplitude distribution image and a phase distribution image.

5. The holography reconstruction method according to claim 4,
wherein the charged particle beam diffracted with the diffraction grating is a spiral wave.

6. The holography reconstruction method according to claim 5,
determining a center of the selected side band;
moving a center point of the side band to a calculation origin; and
performing the Fourier inverse transform.

7. The holography reconstruction method according to claim 6,
further comprising:
performing a focus correction calculation on the side band moved to the calculation origin; and
performing the Fourier inverse transform.

8. The holography reconstruction method according to claim 6,
further comprising:
processing one of positive and negative diffraction spots of the diffracted charged particle beam as the spiral wave, irradiated to the sample placed on the diffraction surface of the diffraction grating.

9. The holography reconstruction method according to claim 8,
further comprising:
performing the Fourier transform on the hologram by the other diffraction spot; and
determining the center of the side band.

10. The holography reconstruction method according to claim 5,
further comprising:
summing and displaying a plurality of reconstructed images corresponding to a plurality of degrees of the diffraction spots of the diffracted charged particle beam as the spiral wave.

11. A non-transitory computer readable medium upon which is embodied a sequence of programmed instructions for holography reconstruction which, when executed by a processor to process image data
cause the processor to perform operations comprising:
irradiate a sample on a diffraction surface of a diffraction grating with a charged particle beam;
make an opening region of the diffraction grating smaller than an irradiation region of the charged particle beam to the diffraction grating, with the irradiation region of the charged particle beam diffracted with the diffraction grating being within the irradiation region of the charged particle beam transmitted through the diffraction grating;
detect an image formed using the charged particle beam passed through the diffraction surface;
select at least one of a plurality of holograms obtained based on image data associated with the detected image; and
perform a Fourier transform on the selected hologram,
wherein the diffraction grating is formed of a material having permeability with respect to the charged particle beam.

12. The non-transitory computer readable medium according to claim 11,
- wherein the charged particle beam diffracted with the diffraction grating is a spiral wave, and
- wherein the processor is further configured to perform operations comprising:
- perform the Fourier transform on the plurality of holograms;
- select one side band of an obtained intensity distribution image;
- determine a center of the selected side band;
- move a center point of the side band to a calculation origin; and
- perform a Fourier inverse transform.

13. The non-transitory computer-readable medium according to claim 12,
- wherein the processor is further configured to perform operations comprising:
- perform a focus correction calculation on the side band moved to the calculation origin and
- perform the Fourier inverse transform.

14. The non-transitory computer-readable medium according to claim 13,
- wherein the processor is further configured to perform operations comprising:
- irradiate one of positive and negative diffraction spots of the diffracted charged particle beam as the spiral wave to the sample placed on the diffraction surface of the diffraction grating.

15. The holography reconstruction program according to claim 14,
- wherein the processor is further configured to perform operations comprising:
- perform the Fourier transform on the hologram by the other diffraction spot; and
- determine the center of the side band.

* * * * *